US009583656B2

(12) United States Patent
Nozawa et al.

(10) Patent No.: US 9,583,656 B2
(45) Date of Patent: Feb. 28, 2017

(54) PHOTOELECTRIC CONVERSION ELEMENT

(71) Applicants: Sharp Kabushiki Kaisha, Osaka-shi, Osaka (JP); The University of Tokyo, Bunkyo-ku, Tokyo (JP)

(72) Inventors: Tomohiro Nozawa, Osaka (JP); Yasuhiko Arakawa, Bunkyo-ku (JP)

(73) Assignees: SHARP KABUSHIKI KAISHA, Sakai (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 14/763,259

(22) PCT Filed: Dec. 18, 2013

(86) PCT No.: PCT/JP2013/083919
§ 371 (c)(1),
(2) Date: Jul. 24, 2015

(87) PCT Pub. No.: WO2014/122861
PCT Pub. Date: Aug. 14, 2014

(65) Prior Publication Data
US 2015/0364628 A1    Dec. 17, 2015

(30) Foreign Application Priority Data

Feb. 7, 2013    (JP) .................................. 2013-022468

(51) Int. Cl.
*H01L 31/044* (2014.01)
*H01L 31/0352* (2006.01)
*H01L 31/0304* (2006.01)

(52) U.S. Cl.
CPC .. *H01L 31/035236* (2013.01); *H01L 31/0304* (2013.01); *H01L 31/03046* (2013.01);
(Continued)

(58) Field of Classification Search
CPC ........ H01L 31/00–31/078; Y02E 10/50–10/60
(Continued)

(56) References Cited

U.S. PATENT DOCUMENTS

2008/0251116 A1    10/2008  Green
2011/0308590 A1    12/2011  Asami et al.
(Continued)

FOREIGN PATENT DOCUMENTS

JP    63-40382 A    2/1988
JP    06-260679 A    9/1994
(Continued)

OTHER PUBLICATIONS

Official Communication issued in International Patent Application No. PCT/JP2013/083919, mailed on Feb. 10, 2014.
(Continued)

*Primary Examiner* — Bach Dinh
(74) *Attorney, Agent, or Firm* — Keating & Bennett, LLP

(57) ABSTRACT

A photoelectric conversion element according to the present invention includes a photoelectric conversion layer. The photoelectric conversion layer includes a p-type semiconductor layer, an n-type semiconductor layer, and a superlattice semiconductor layer which is interposed between the p-type semiconductor layer and the n-type semiconductor layer. The superlattice semiconductor layer has a superlattice structure in which barrier layers and quantum layers are stacked alternately and repeatedly, and is provided so as to form an intermediate energy band between an upper end of a valence band of the barrier layer and a lower end of a conduction band of the barrier layer. The intermediate energy band is formed from a region of the superlattice semiconductor layer, which is near to the p-type semiconductor layer, to a region of the superlattice semiconductor layer, which is near to the n-type semiconductor layer, and the intermediate energy band has a region having a wide band width and a region having a narrow band width.

14 Claims, 15 Drawing Sheets

(52) U.S. Cl.
CPC ........ *H01L 31/035218* (2013.01); *H01L 31/035263* (2013.01); *Y02E 10/544* (2013.01)

(58) Field of Classification Search
USPC .............................. 136/243–265
See application file for complete search history.

(56) References Cited

U.S. PATENT DOCUMENTS

| | | | | |
|---|---|---|---|---|
| 2012/0097228 A1* | 4/2012 | Yoshikawa | ............ | B82Y 20/00 136/255 |
| 2012/0285537 A1* | 11/2012 | Yoshikawa | ............ | B82Y 20/00 136/262 |
| 2015/0021731 A1 | 1/2015 | Yazawa et al. | | |

FOREIGN PATENT DOCUMENTS

| | | |
|---|---|---|
| JP | 11-220150 A | 8/1999 |
| JP | 2007-535806 A | 12/2007 |
| JP | 2012-023358 A | 2/2012 |
| JP | 2012-089756 A | 5/2012 |
| JP | 2012-094588 A | 5/2012 |
| JP | 2012-169306 A | 9/2012 |
| WO | 2013/157180 A1 | 10/2013 |

OTHER PUBLICATIONS

Tomic, "Intermediate-band solar cells: Influence of band formation on dynamical processes in InAs/GaAs quantum dot arrays", Physical Review B 82, 195321, 2010, pp. 1-15.

\* cited by examiner

PHOTOELECTRIC CONVERSION ELEMENT

TECHNICAL FIELD

The present invention relates to a photoelectric conversion element which has a superlattice structure.

BACKGROUND ART

A photovoltaic element has attracted attention as a clean energy source which does not discharge $CO_2$, and the photovoltaic element has come into wide use. Currently, the photovoltaic element most widespread is a single-junction solar cell which is manufactured by using silicon. However, in a silicon solar cell in the related art, it is difficult to photoelectrically convert light in a long wavelength region in the solar spectrum, and a large amount of solar energy is not used.

A solar cell having a superlattice structure in terms of efficiently using solar energy unused has attracted attention (for example, see NPL 1). The superlattice structure corresponds to a structure in which quantum layers (quantum dot layers or quantum well layers) having substantially a thickness of several nm to 100 nm and barrier layers are alternately stacked. In the superlattice structure, an intermediate energy band can be formed between an upper end of a valence band of the barrier layer and a lower end of a conduction band of the barrier layer.

A photoelectric conversion element which has a superlattice structure and in which an intermediate energy band is formed has a band diagram as illustrated in FIG. 15, for example. An electron in the valence band is photoexcited to an intermediate energy band 125 by incident light, and an electron 122 in the intermediate energy band 125 is photoexcited to a conduction band 130 by incident light. An internal electric field causes an electron 128 in the conduction band to move to an n-type semiconductor layer, and thus light energy can be converted into electrical energy.

The intermediate energy band 125 has a potential gradient which is formed by the internal electric field. However, the gradient is small in many cases. The electron 122 in the intermediate energy band 125 is subjected to any of the following processes: (1) moving in the intermediate energy band 125; (2) optically transitioning to the conduction band; and (3) recombining with a hole 123 in the valence band.

CITATION LIST

Non Patent Literature

NPL 1: Physical Review B, 82, 195321 (2010)

SUMMARY OF INVENTION

Technical Problem

However, in the photoelectric conversion element of the related art, which has a superlattice structure, only a photoelectric conversion ratio much lower than a theoretically realizable photoelectric conversion ratio has been achieved. As a reason, it is considered that there is a high probability of an electron which has optically transitioned from the valence band to the intermediate energy band recombining with a hole which has been generated in the valence band in accordance with this optical transition. In addition, it is considered that the probability of an electron recombining with a hole tends to increase in a high electron concentration region in the intermediate energy band (for example, an interface between the superlattice semiconductor and the n-type semiconductor).

Considering such circumstances, the present invention provides a photoelectric conversion element which can achieve a reduced number of performed recombination processes of an electron and a hole and which can increase a photoelectric conversion ratio.

Solution to Problem

The invention provides a photoelectric conversion element including a photoelectric conversion layer which includes a p-type semiconductor layer, an n-type semiconductor layer, and a superlattice semiconductor layer which is interposed between the p-type semiconductor layer and the n-type semiconductor layer, in which the superlattice semiconductor layer has a superlattice structure in which barrier layers and quantum layers have been stacked alternately and repeatedly, and is provided so as to form an intermediate energy band between an upper end of a valence band of the barrier layer and a lower end of a conduction band of the barrier layer, and the intermediate energy band is formed from a region of the superlattice semiconductor layer, which is near to the p-type semiconductor layer, to a region of the superlattice semiconductor layer, which is near to the n-type semiconductor layer, and the intermediate energy band has a region having a wide band width and a region having a narrow band width.

Advantageous Effects of Invention

According to the present invention, the photoelectric conversion layer which includes the p-type semiconductor layer, the n-type semiconductor layer, and the superlattice semiconductor layer which is interposed between the p-type semiconductor layer and the n-type semiconductor layer is included. Thus, it is possible to photoelectrically convert light incident to the photoelectric conversion layer by using an internal electric field which is formed between the p-type semiconductor layer and the n-type semiconductor layer, and to generate photovoltaic power.

According to the present invention, the superlattice semiconductor layer has a superlattice structure in which the barrier layer and the quantum layer are stacked alternately and repeatedly, and is provided so as to form an intermediate energy band between the upper end of the valence band of the barrier layer and the lower end of the conduction band of the barrier layer. Thus, it is possible for an electron in the valence band to optically transition to the conduction band through the intermediate energy band. Accordingly, it is possible to generate photovoltaic power and increase the photoelectric conversion ratio using light in the long wavelength region of the solar spectrum.

According to the present invention, the intermediate energy band is formed from the region of the superlattice semiconductor layer, which is near to the p-type semiconductor layer, to the region of the superlattice semiconductor layer, which is near to the n-type semiconductor layer. Thus, it is possible to move an electron in the intermediate energy band, to suppress recombination of an electron in the intermediate energy band and a hole in the valence band, and to increase the photoelectric conversion ratio.

According to the present invention, the intermediate energy band has a region having a wide band width and a region having a narrow band width. Thus, it is possible to generate an energy difference between the region having a wide band width and the region having a narrow band width. This energy difference allows an electron in the region of the intermediate energy band, which has a narrow band width, to move to the region of the intermediate energy band, which has a wide band width. Accordingly, it is possible to spatially separate from each other an electron which has optically transitioned to the region of the intermediate energy band, which has a narrow band width, and a hole which has been generated in the valence band by this optical transition, and to suppress recombination of the electron and the hole. It is possible to increase a probability of an electron in the valence band optically transitioning to the conduction band, and to increase the photoelectric conversion ratio of the photoelectric conversion element by suppressing the recombination.

According to the present invention, the intermediate energy band has a region having a wide band width. Thus, it is possible to increase an absorption band of an optical spectrum between the intermediate energy band and the conduction band in this region. Accordingly, it is possible to increase a photoexcitation speed from the intermediate energy band in the region having a wide band width in which electrons easily accumulate to the conduction band. Thus, it is possible to increase the photoelectric conversion ratio of the photoelectric conversion element.

DESCRIPTION OF EMBODIMENTS

Figure 1:
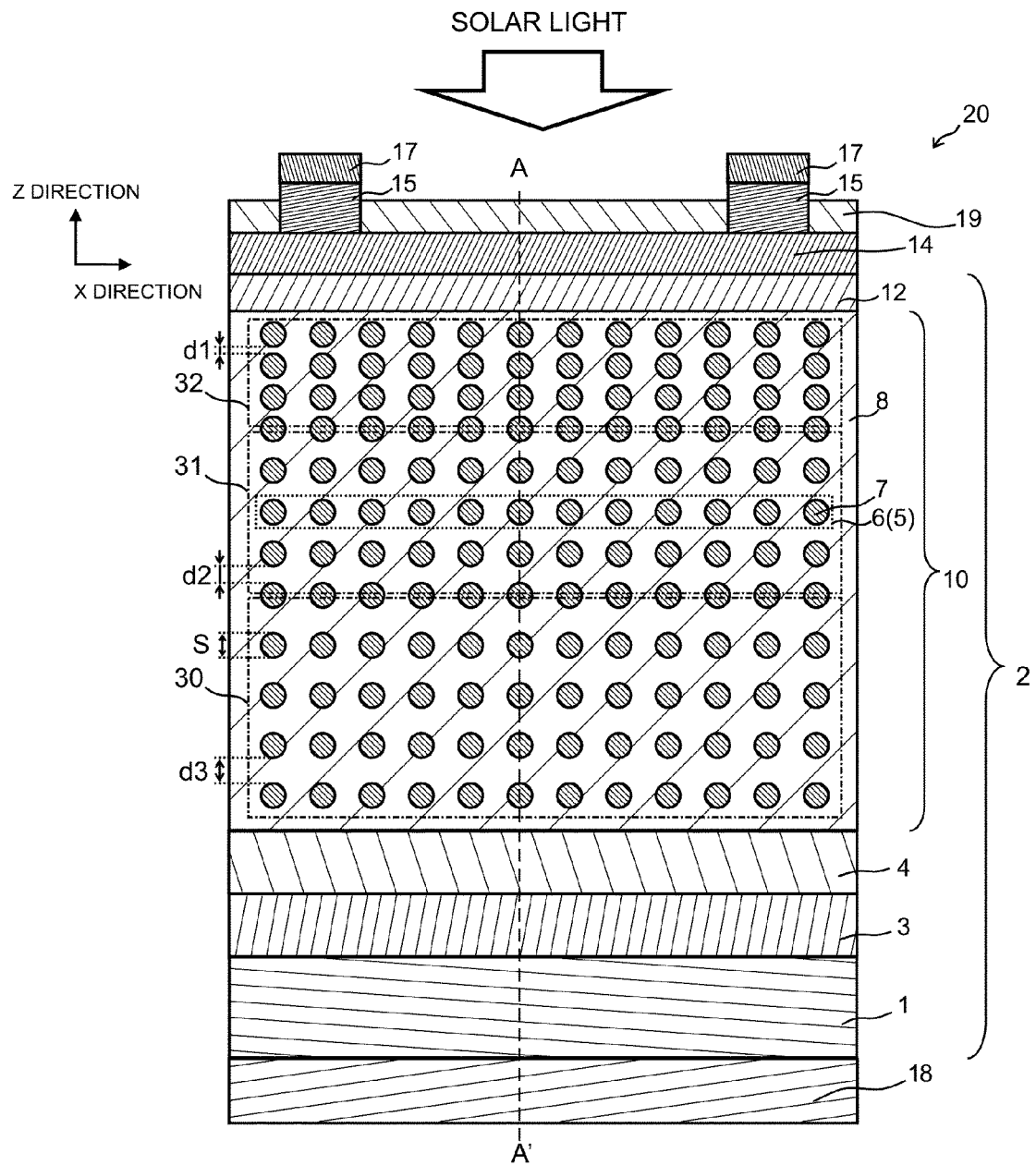
FIG. 1 is a schematic sectional view illustrating a configuration of a photoelectric conversion element according to an embodiment of the present invention.

A photoelectric conversion element according to the present invention includes a photoelectric conversion layer. The photoelectric conversion layer includes a p-type semiconductor layer, an n-type semiconductor layer, and a superlattice semiconductor layer which is interposed between the p-type semiconductor layer and the n-type semiconductor layer. The superlattice semiconductor layer has a superlattice structure in which a barrier layer and a quantum layer are stacked alternately and repeatedly, and is provided so as to form an intermediate energy band between an upper end of a valence band of the barrier layer and a lower end of a conduction band of the barrier layer. The intermediate energy band is formed from a region of the superlattice semiconductor layer, which is near to the p-type semiconductor layer, to a region of the superlattice semiconductor layer, which is near to the n-type semiconductor layer. The intermediate energy band has a region having a wide band width and a region having a narrow band width.

In the present invention, the superlattice structure is a structure in which the barrier layer and the quantum layer are stacked alternately and repeatedly, and the barrier layer and the quantum layer are formed from a semiconductor and have different band gaps. A wave function of an electron in the quantum layer may interact significantly with a wave function of an electron in the adjacent quantum layer.

In the present invention, the quantum layer corresponds to a quantum dot layer or a quantum well layer.

In the present invention, a quantum dot is a semiconductor fine particle having a particle size of equal to or less than 100 nm and is a fine particle which is surrounded by a semiconductor having a band gap larger than that of a semiconductor which constitutes the quantum dot.

In the present invention, a quantum well is a semiconductor thin film having a thickness of equal to or less than 100 nm and is a thin film which is surrounded by a semiconductor having a band gap larger than that of a semiconductor which constitutes the quantum well.

In the present invention, the quantum dot layer is a layer which is formed by quantum dots and is a well layer having a superlattice structure.

In the present invention, the quantum well layer is a layer which is formed by quantum wells and is a well layer having a superlattice structure.

In the present invention, the barrier layer is formed of a semiconductor material having a band gap larger than that of a semiconductor material which forms the quantum layer, and the barrier layer forms a potential barrier around the quantum dot or the quantum well.

In the present invention, the intermediate energy band refers to a continuous band which is formed in the middle of a forbidden band in a semiconductor which forms the superlattice semiconductor layer. A wave function of an electron in the quantum layer in the superlattice structure interacts with a wave function of an electron in the adjacent quantum layer, and thus the resonant tunneling effect occurs between quantum levels of the quantum layers, and the quantum levels are coupled to one another to form an intermediate band. The intermediate energy band is also referred to as an intermediate band.

The band width of the intermediate energy band becomes wider as a distance between two adjacent quantum layers becomes shorter and becomes narrower as this distance becomes longer. This is because wave functions of electrons in two adjacent quantum layers overlap each other more as a distance between the two quantum layers becomes smaller, and these wave functions overlap each other less as the distance between the two quantum layers becomes larger.

In the photoelectric conversion element according to the present invention, the superlattice semiconductor layer preferably has a region having a large distance between two adjacent quantum layers and a region having a small distance between the two adjacent quantum layers. The intermediate energy band of the region having the wide band width is preferably formed in the region of the superlattice semiconductor layer, which has a small distance between two adjacent quantum layers. The intermediate energy band of the region having the small band width is preferably formed in the region of the superlattice semiconductor layer, which has a large distance between the two adjacent quantum layers.

According to such a configuration, the intermediate energy band which has the region having the wide band width and the region having the narrow band width is formed in the superlattice semiconductor layer, and thus it is possible to suppress recombination of an electron in the intermediate energy band and a hole in the valence band. Accordingly, it is possible to increase the probability of an electron in the valence band optically transitioning to the conduction band, and to increase the photoelectric conversion ratio of the photoelectric conversion element.

In the photoelectric conversion element according to the present invention, the intermediate energy band of the region having the wide band width is preferably formed in the region of the superlattice semiconductor layer, which is near to the n-type semiconductor layer.

According to such a configuration, it is possible to move an electron in the intermediate energy band toward the n-type semiconductor layer and to spatially rapidly separate an electron and a hole which are generated in the superlattice semiconductor layer. Accordingly, in the superlattice semiconductor layer, it is possible to decrease the speed of an electron in the intermediate energy band and a hole in the valence band recombining. Further, it is possible to widen an absorbable solar spectrum region by forming a region having the wide intermediate energy band width in the superlattice structure and to increase an optical transition speed of an electron from the intermediate energy band to the conduction band. Accordingly, it is possible to increase the photoelectric conversion ratio of the photoelectric conversion element.

In the photoelectric conversion element according to the present invention, the superlattice semiconductor layer preferably contains n-type dopants. Preferably, the region of the superlattice semiconductor layer, which is near to the n-type semiconductor layer has an n-type doping concentration higher than that of other regions of the superlattice semiconductor layer.

According to such a configuration, it is possible to reduce a hole concentration in the valence band in the region of the superlattice semiconductor layer, which is near to the n-type semiconductor layer. Accordingly, it is possible to decrease the speed of an electron in the intermediate energy band and a hole in the valence band recombining in the region of the superlattice semiconductor layer, which is near to the n-type semiconductor layer and in which the intermediate energy band where electrons easily accumulate by the internal electric field is formed. Accordingly, it is possible to increase the probability of an electron in the intermediate energy band optically transitioning to the conduction band and to increase the photoelectric conversion ratio of the photoelectric conversion element.

In the photoelectric conversion element according to the present invention, the superlattice semiconductor layer preferably contains n-type dopants and has a region having a high n-type doping concentration and a region having a low n-type doping concentration. The intermediate energy band of the region having a wide band width is preferably formed in the region of the superlattice semiconductor layer, which has a high n-type doping concentration. The intermediate energy band of the region having a narrow band width is preferably formed in the region of the superlattice semiconductor layer, which has a low n-type doping concentration.

According to such a configuration, it is possible to reduce the hole concentration in the valence band in the region of the superlattice semiconductor layer, in which the intermediate energy band of the region having a wide band width is formed. Accordingly, it is possible to decrease the speed of an electron in the intermediate energy band and a hole in the valence band recombining in the region in which electrons easily accumulate due to a difference between the band widths. Accordingly, it is possible to increase the probability of an electron in the intermediate energy band optically transitioning to the conduction band and to increase the photoelectric conversion ratio of the photoelectric conversion element.

Hereinafter, an embodiment according to the present invention will be described with reference to the accompanying drawings. Configuration described in the following descriptions or illustrated in the drawings are only examples. The scope of the present invention is not limited to the drawings or the following descriptions.

Configuration and Manufacturing Method of Photoelectric Conversion Element

Figure 7:
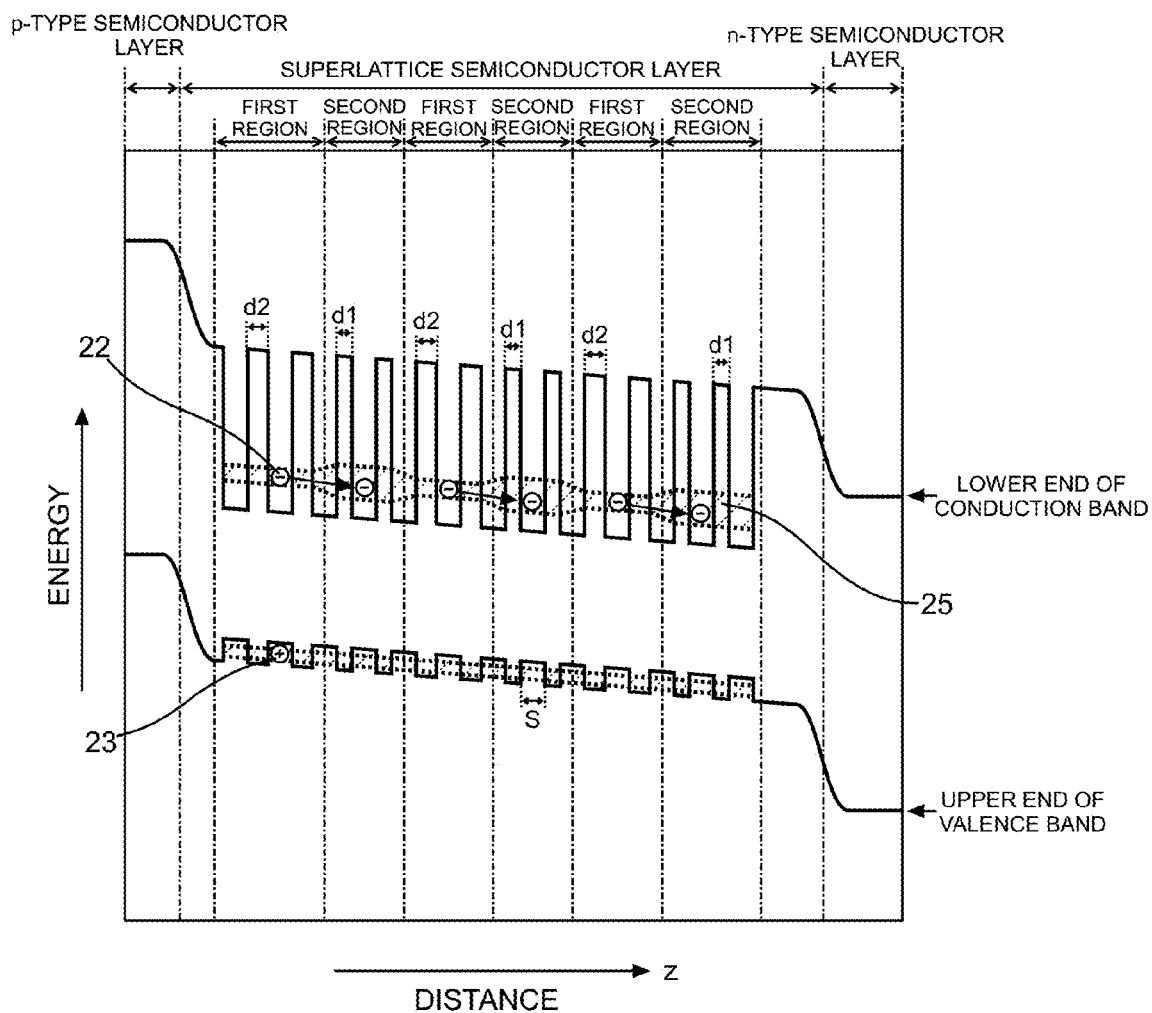
FIG. 7 is a schematic band diagram of a photoelectric conversion layer taken along dashed line E-E' in FIG. 6.
Figure 8:
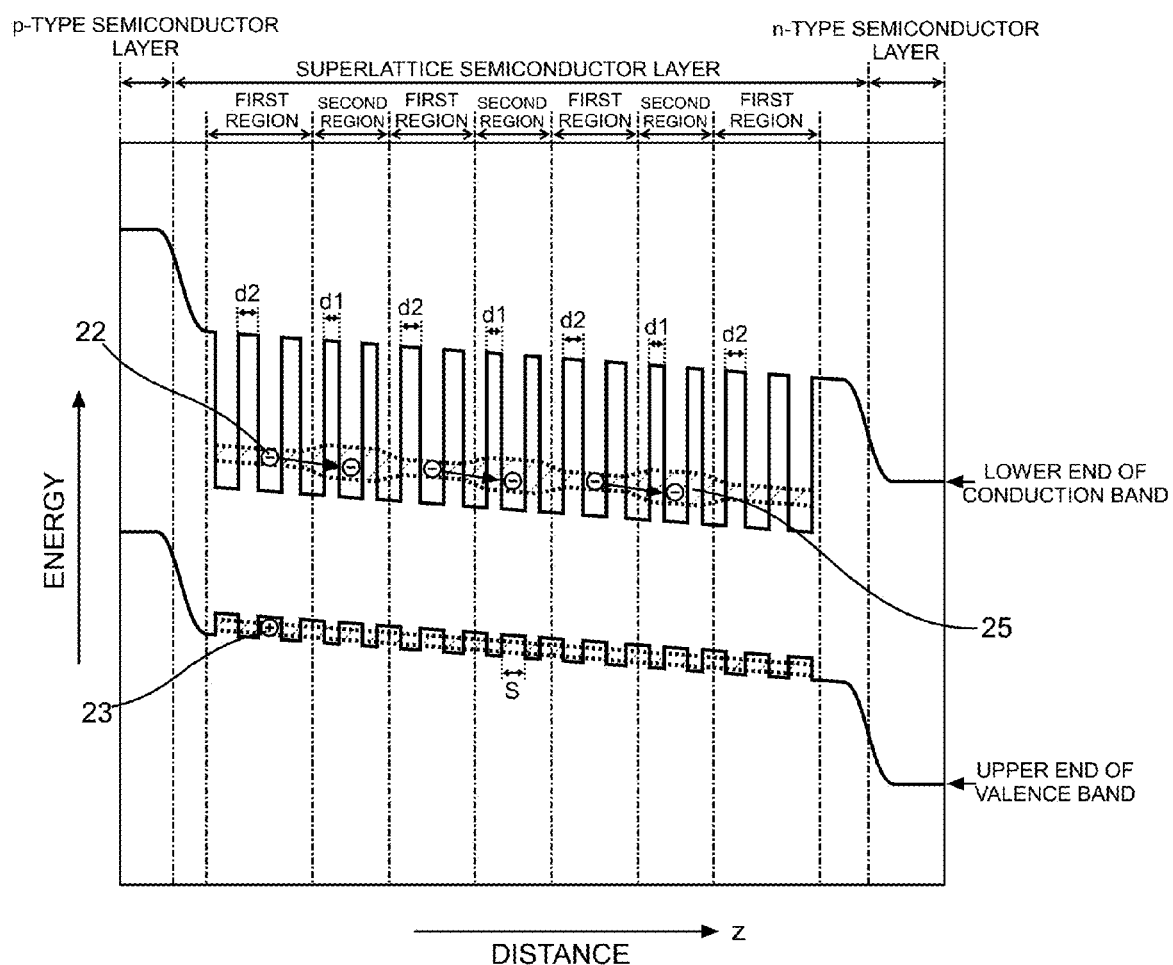
FIG. 8 is a schematic band diagram of a photoelectric conversion layer included in a photoelectric conversion element according to an embodiment of the present invention.
Figure 9:
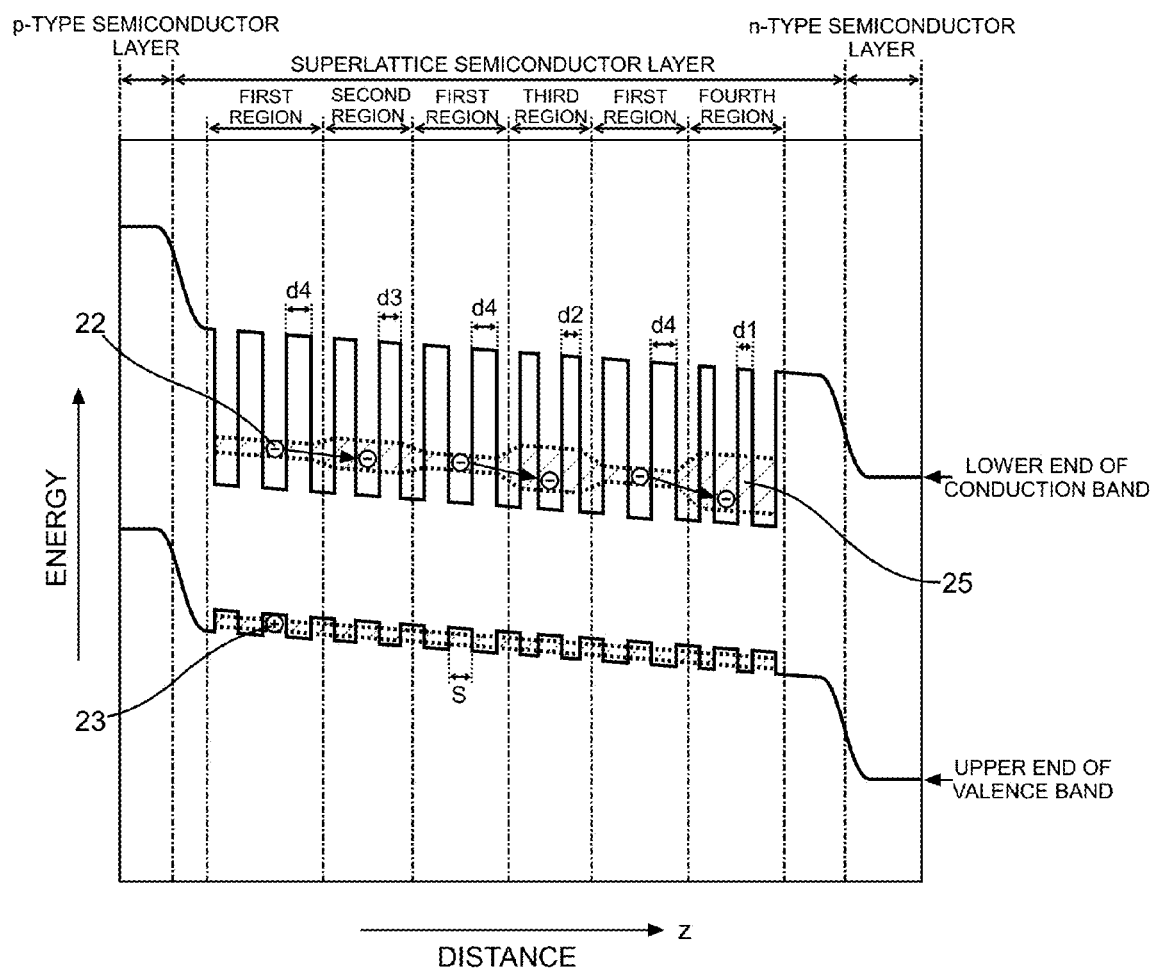
FIG. 9 is a schematic band diagram of a photoelectric conversion layer included in a photoelectric conversion element according to an embodiment of the present invention.

FIGS. 1, 2, 4, and 6 are schematic sectional views illustrating a configuration of a photoelectric conversion element according to this embodiment. FIG. 3 is a schematic band diagram of a photoelectric conversion layer taken along dashed line A-A' in FIG. 1. FIG. 5 is a schematic band diagram of a photoelectric conversion layer taken along dashed line C-C' in FIG. 4. FIG. 7 is a schematic band diagram of a photoelectric conversion layer taken along dashed line E-E' in FIG. 6. FIGS. 8 and 9 are schematic band diagrams of the photoelectric conversion layer included in the photoelectric conversion element according to this embodiment.

A photoelectric conversion element 20 according to this embodiment includes a photoelectric conversion layer 2. A photoelectric conversion layer 2 includes a p-type semiconductor layer 4, an n-type semiconductor layer 12, and a superlattice semiconductor layer 10 which is interposed between the p-type semiconductor layer 4 and the n-type semiconductor layer 12. The superlattice semiconductor layer 10 has a superlattice structure in which the barrier layer 8 and the quantum layer 5 are stacked alternately and repeatedly. The superlattice semiconductor layer 10 is provided such that the intermediate energy band 25 is formed between the upper end of a valence band of the barrier layer 8 and the lower end of a conduction band of the barrier layer 8. The intermediate energy band 25 is formed from the region of the superlattice semiconductor layer 10, which is near to the p-type semiconductor layer 4, to the region of the superlattice semiconductor layer 10, which is near to the n-type semiconductor layer 12. In addition, the intermediate energy band 25 has a region having a wide band width and a region having a narrow band width.

The photoelectric conversion element 20 corresponds to a solar cell, a photo-detector, and the like, for example.

The photoelectric conversion element 20 according to this embodiment will be described below.

1. Photoelectric Conversion Layer

The photoelectric conversion layer 2 is a layer in which light energy of incident light is converted into electrical energy. The photoelectric conversion layer 2 includes the p-type semiconductor layer 4, the n-type semiconductor layer 12, and the superlattice semiconductor layer 10, which is interposed between the p-type semiconductor layer 4 and the n-type semiconductor layer 12. The photoelectric conversion layer 2 may have a pin-junction, a ppn-junction, and a pnn-junction. The photoelectric conversion layer 2 having such a configuration enables a photovoltaic power to be generated by the light energy of the incident light.

The photoelectric conversion layer 2 may be provided such that the p-type semiconductor layer 4 side is set as a light receiving surface or may be provided such that the n-type semiconductor layer 12 side is set as the light receiving surface. However, it is preferable that the photoelectric conversion layer 2 be provided such that the n-type semiconductor layer 12 is set as the light receiving surface. With this, it is possible to increase the amount of light which is absorbed in the region of the superlattice semiconductor layer 10, which is near to the n-type semiconductor layer 12, and to increase the speed of an electron in the intermediate energy band 25, which is formed in the region of the superlattice semiconductor layer 10, which is near to the n-type semiconductor layer 12, optically transitioning to the conduction band. Thus, it is possible to suppress the excessive increase in electron concentration in the intermediate energy band 25 in the region of the superlattice semiconductor layer 10, which is near to the n-type semiconductor layer 12. It is possible to decrease the speed of an electron in the intermediate energy band 25 and a hole in the valence band recombining and to increase the photoelectric conversion ratio of the photoelectric conversion element 20. Since an electron moves in a direction of a low electron energy potential in accordance with a gradient which is formed by the internal electric field in the intermediate energy band 25, if an optimal design is not employed, the electron concentration in the intermediate energy band 25 in the region of the superlattice semiconductor layer 10, which is near to the n-type semiconductor layer 12, tends to increase.

2. N-Type Semiconductor Layer and P-Type Semiconductor Layer

The n-type semiconductor layer 12 is formed of a semiconductor which contains n-type impurities. The p-type semiconductor layer 4 is formed of a semiconductor which contains p-type impurities. The superlattice semiconductor layer 10 is interposed between the n-type semiconductor layer 12 and the p-type semiconductor layer 4, and thus the n-type semiconductor layer 12 and the p-type semiconductor layer 4 constitute the photoelectric conversion layer 2. The n-type semiconductor layer 12 and the p-type semiconductor layer 4 cause the internal electric field to be formed in the photoelectric conversion layer 2.

The n-type semiconductor layer 12 and the p-type semiconductor layer 4 may be formed by using, for example, an MOCVD method and an MBE method.

The n-type semiconductor layer 12 may be electrically connected to an n-type electrode 17. The p-type semiconductor layer 4 may be electrically connected to a p-type electrode 18. With this, it is possible to output a photovoltaic power, which is generated between the n-type semiconductor layer 12 and the p-type semiconductor layer 4, to an external circuit through the n-type electrode 17 and the p-type electrode 18. A contact layer 15 may be provided between the n-type semiconductor layer 12 and the n-type electrode 17 or between the p-type semiconductor layer 4 and the p-type electrode 18.

3. Superlattice Semiconductor Layer

The superlattice semiconductor layer 10 is interposed between the n-type semiconductor layer 12 and the p-type semiconductor layer 4 and thus constitutes the photoelectric conversion layer 2. The superlattice semiconductor layer 10 has a superlattice structure in which the quantum layer 5 and the barrier layer 8 are stacked alternately and repeatedly.

Figure 4:
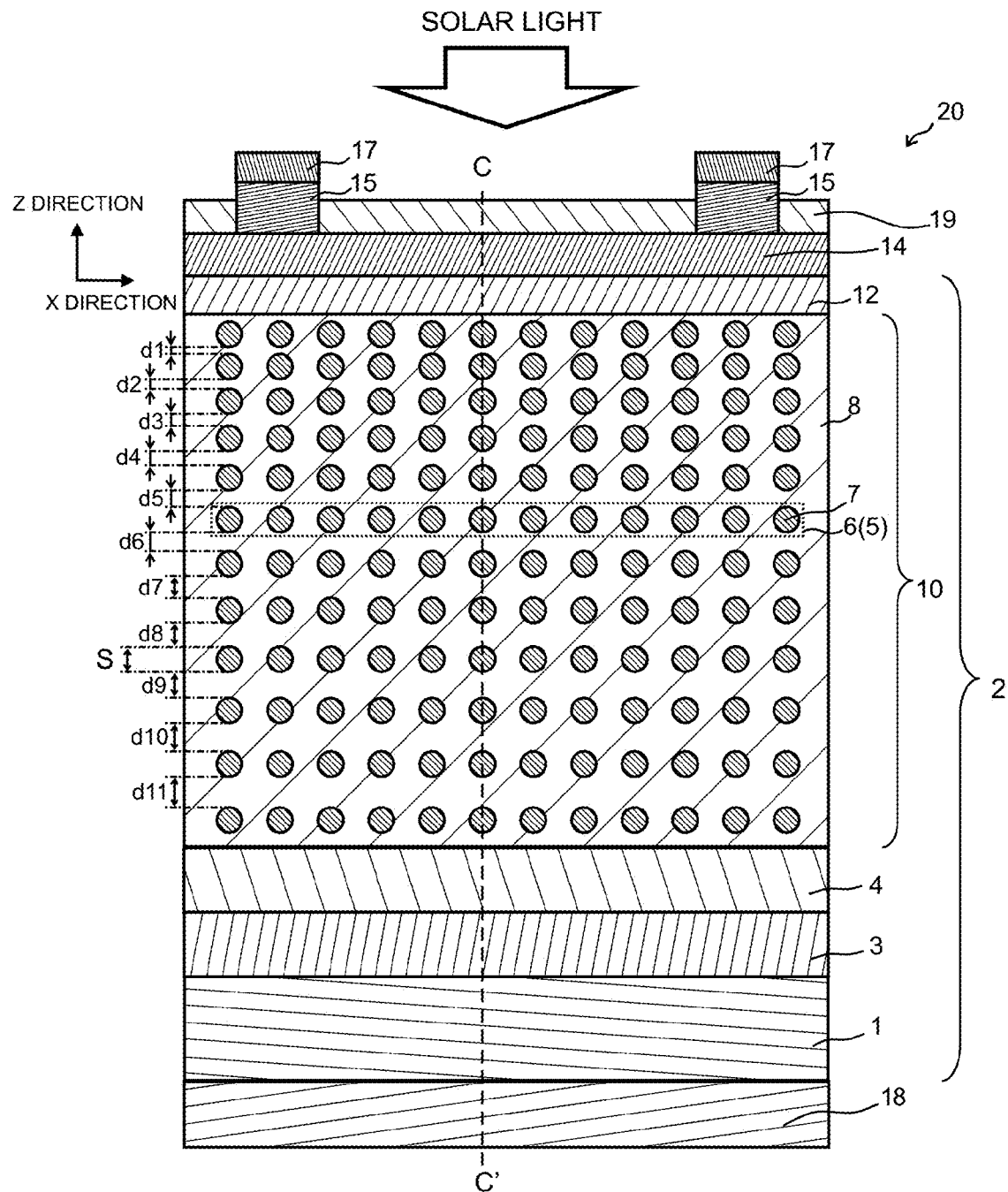
FIG. 4 is a schematic sectional view illustrating a configuration of a photoelectric conversion element according to an embodiment of the present invention.
Figure 5:
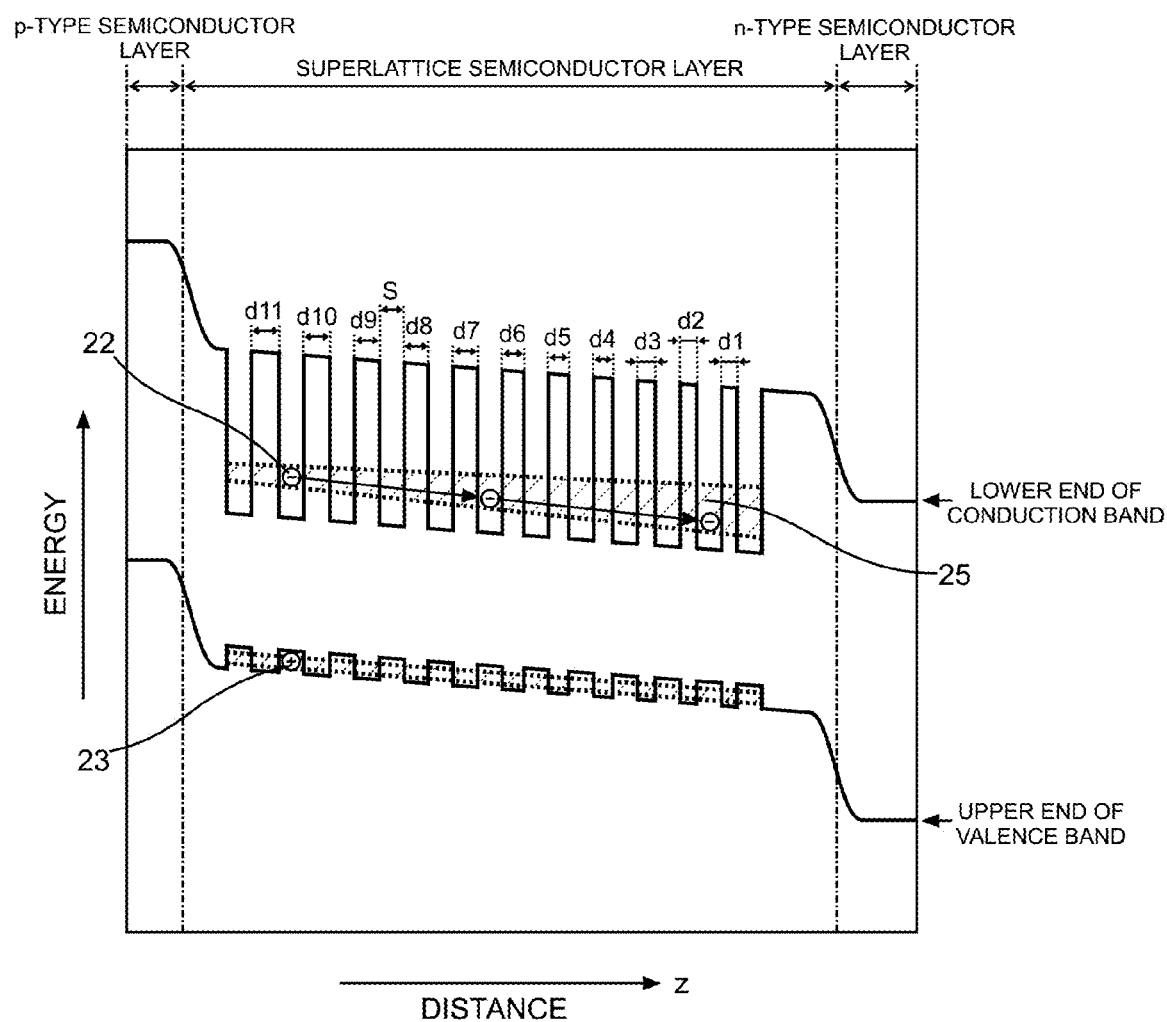
FIG. 5 is a schematic band diagram of a photoelectric conversion layer taken along dashed line C-C' in FIG. 4.
Figure 6:
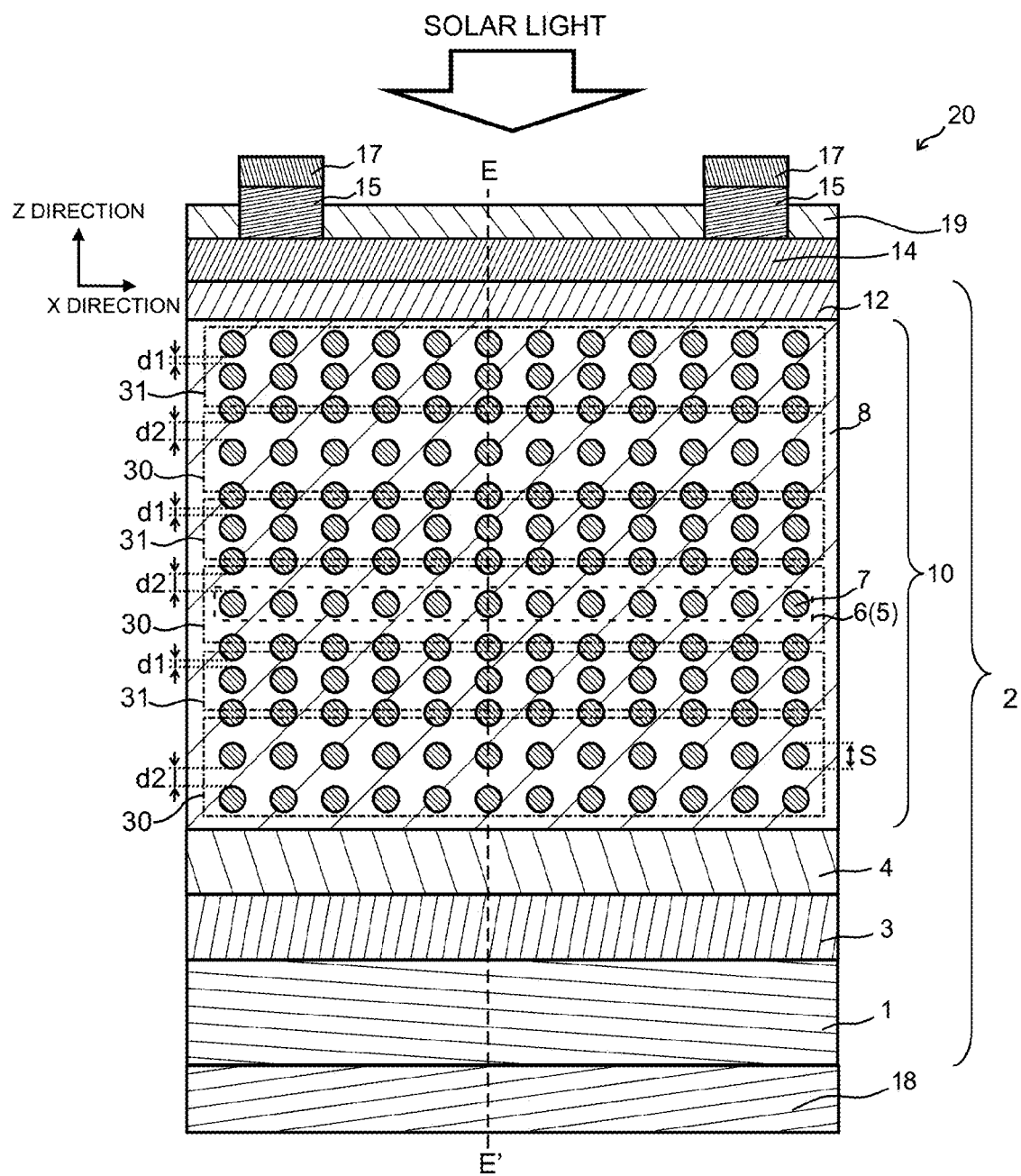
FIG. 6 is a schematic sectional view illustrating a configuration of a photoelectric conversion element according to an embodiment of the present invention.

The quantum layer 5 may be a quantum dot layer 6 which is formed from a plurality of quantum dots 7, as in the photoelectric conversion element 20 illustrated in FIGS. 1, 4, and 6. The quantum layer 5 may be a quantum well layer 9, as in the photoelectric conversion element 20 illustrated in FIG. 2.

The quantum dot layer 6 is a layer which includes the plurality of quantum dots 7. Each of the quantum dots 7 is formed of a semiconductor material having a band gap narrower than that of a semiconductor material which forms the barrier layer 8, and a quantum dot 7 has a quantum level in accordance with the quantum effect.

All of the plurality of quantum dots 7 which are included in the superlattice semiconductor layer 10 may be formed of the same material. In addition, the plurality of quantum dots 7 may include some quantum dots 7 which are formed of different materials. When the plurality of quantum dots 7 which are included in the superlattice semiconductor layer 10 are formed of a crystal mixture, the plurality of quantum dots 7 may include multiple types of quantum dots 7, which are formed of different crystal mixtures. The material of the quantum dots 7 may be changed for each quantum dot layer 6.

The plurality of quantum dots 7 which are included in the superlattice semiconductor layer 10 may have substantially the same size in an x direction, in a y direction, and in a z direction. The plurality of quantum dots 7 may include multiple types of quantum dots 7, which have different sizes.

The quantum dot layer 6 which includes the quantum dots 7 may be manufactured by using SK growth.

The barrier layer 8 is formed of a semiconductor material having a band gap wider than that of a semiconductor material which forms the quantum dot 7 or the quantum well layer 9. The barrier layer 8 forms a potential barrier around the quantum dot 7 or the quantum well layer 9.

In this embodiment, the photoelectric conversion element 20 may use, for example, the quantum dot layer 6 which is formed of $In_xGa_{1-x}As$ and the barrier layer 8 which is formed of $Al_xGa_{1-x}As$ in the superlattice semiconductor layer 10. In addition, the quantum dot layer 6 which is formed of $In_xAs_{1-x}Sb$ and the barrier layer 8 which is formed of $Al_xAs_{1-x}Sb$ may be used. A material such as InAs, GaAs, AlAs, InSb, GaSb, AlSb, InP, GaP, and AlP, and a crystal mixture material thereof may be used in the superlattice semiconductor layer 10. As materials forming the barrier layer 8 and the quantum dot layer 6 constituting the superlattice semiconductor layer 10, $Al_xGa_yIn_{1-x-y}As$, $Al_xGa_yIn_{1-x-y}Sb_zAs_{1-z}$, $Al_xGa_yIn_{1-x-y}P$, and $Al_xGa_yIn_{1-x-y}N$ may be used. A III-V group compound semiconductor, a chalcopyrite material, a II-VI group compound semiconductor, a IV group semiconductor, or a crystal mixture material thereof may be used in addition to the above materials.

Regarding the quantum dot layer 6 which is formed from the crystal mixture, and the barrier layer 8, appropriately changing an element ratio of the crystal mixture allows a lattice constant to be changed to a desired value or to be changed so as to match a substrate, or allows a band energy offset (a valence band energy difference between the quantum dot layer 6 and the barrier layer 8) of the valence band to be set to zero.

The superlattice semiconductor layer 10 may contain n-type dopants. The superlattice semiconductor layer 10 may have a region having a relatively high n-type doping concentration and a region having a relatively low n-type doping concentration.

The superlattice semiconductor layer 10 is provided so as to form the intermediate energy band 25 between the upper end of the valence band of the barrier layer 8 and the lower end of the conduction band of the barrier layer 8. Accordingly, it is possible for an electron in the valence band to optically transition to the conduction band through the intermediate energy band, and thus it is possible to generate a photovoltaic power by using incident light in the long wavelength. For example, the quantum layer 5 and the barrier layer 8 may be provided so as to form the intermediate energy band 25 as illustrated in band diagrams of FIGS. 3, 5, 7, 8, and 9.

The intermediate energy band 25 may be formed by causing a distance between two adjacent quantum layers 5 to become short. Causing the distance to become short enables wave functions of electrons in the two adjacent quantum layers 5 to interact with each other, and thus it is possible to generate a resonant tunneling effect between quantum levels of the quantum layers 5. Thus, it is possible to form the intermediate energy band 25 in the superlattice semiconductor layer 10.

The intermediate energy band 25 is formed from the region near to the n-type semiconductor layer 12 to the region of the superlattice semiconductor layer 10, which is near to the p-type semiconductor layer 4. Thus, a range that enables an electron in the intermediate energy band 25 to move in the z direction becomes wider and it is thus possible to decrease the probability of an electron in the intermediate energy band 25 and a hole in the valence band recombining. Accordingly, it is possible to increase the photoelectric conversion ratio. For example, as illustrated in the band diagrams of FIGS. 3, 5, 7, 8, and 9, the quantum layer 5 and the barrier layer 8 may be provided so as to form the intermediate energy band 25 from the region near to the p-type semiconductor layer 4 to the region of the superlattice semiconductor layer 10, which is near to the n-type semiconductor layer 12.

Such an intermediate energy band 25 may be formed by causing a distance between two adjacent quantum layers 5 in the superlattice semiconductor layer 10 to become shorter, for example.

The photoelectric conversion ratio of the photoelectric conversion element in which the intermediate energy band is formed may increase by increasing the following speeds: a speed of an electron in the valence band optically transitioning to the intermediate energy band; a speed of an electron in the intermediate energy band optically transitioning to the conduction band; and a speed of an electron in the valence band optically transitioning to the conduction band. Further, the photoelectric conversion ratio may increase by decreasing the following speeds: a speed of an electron in the conduction band recombining with a level of the intermediate energy band; a speed of an electron in the intermediate energy band recombining with a hole in the valence band; and a speed of an electron in the conduction band recombining with a hole in the valence band.

As a method of increasing a speed of an electron optically transitioning, a method of setting an occupancy ratio of electrons in the intermediate energy band 25 to be in an appropriate range is included.

Optical transition of an electron in the valence band to the intermediate energy band is performed by an electron in the valence band optically transitioning to a level which is not occupied by electrons in the intermediate energy band. Optical transition of an electron in the intermediate energy band to the conduction band is performed by an electron having a level which is occupied by electrons in the intermediate energy band optically transitioning to the conduction band. Accordingly, an electron occupancy ratio of the intermediate energy band (a ratio of a number of states which are occupied by electrons to the total number of states of the intermediate band per volume including an spin-up state and a spin-down state) is set to be in an appropriate range, and thus it is possible to increase the speed of an electron optically transitioning. For example, the electron occupancy ratio of the intermediate energy band 25 is set to be in a range of 30% or more and 70% or less, and thus an electron in the valence band can optically transition to a level which is not occupied by electrons in the intermediate energy band, and an electron in the intermediate energy band can optically transition to the conduction band with efficiency.

As a method of setting the electron occupancy ratio of the intermediate energy band 25 to be in the appropriate range, a method of appropriately adjusting the n-type doping concentration in the superlattice semiconductor layer 10 is included.

If the n-type doping concentration in the superlattice semiconductor layer becomes high, the electron concentration in the intermediate energy band increases and the hole concentration in the valence band decreases. If the n-type doping concentration in the superlattice semiconductor layer becomes small, the electron concentration in the intermediate energy band decreases and the hole concentration in the valence band increases.

The type of dopants in the superlattice semiconductor layer 10 and a doping concentration may be investigated by using a SIMS analysis, for example.

As a method of decreasing the speed of recombination of an electron which optically transitions, a method of decreasing the hole concentration in the valence band is included. The hole concentration in the valence band may be decreased by increasing the n-type doping concentration in the superlattice semiconductor layer.

However, if the n-type doping concentration in the superlattice semiconductor layer increases excessively, the recombination speed of an electron in the conduction band and the level of the intermediate energy band increases. Accordingly, the n-type doping concentration in the superlattice semiconductor layer 10 is appropriately adjusted, and thus a recombination speed of an electron which optically transitions may be decreased.

From the above descriptions, it is possible to increase the photoelectric conversion ratio of the photoelectric conversion element by setting the n-type doping concentration in the superlattice semiconductor layer 10 to be in the appropriate range.

It is considered that a recombination speed between the conduction band and the valence band becomes higher as the product of the electron concentration in the conduction band and the hole concentration in the valence band becomes higher. It is considered that a recombination speed between the intermediate energy band and the valence band becomes higher as the product of the electron concentration in the intermediate energy band and the hole concentration in the valence band becomes higher. It is considered that a recombination speed between the conduction band and the intermediate energy band becomes higher as the product of the electron concentration in the conduction band and the density-of-states, which is not occupied by electrons in the intermediate energy band (a value obtained by subtracting the electron concentration in the intermediate band from the density-of-states of the intermediate energy band) becomes higher.

An average n-type doping concentration ($cm^{-3}$) of the superlattice semiconductor layer 10 may be in a range of 35% or more and 62% or less of two times the number of quantum dots 7 per unit volume (that is, the total number of states of the intermediate band per volume including the spin-up state and the spin-down state), for example. Accordingly, it is possible to increase an optical transition speed of an electron and to decrease the recombination speed of an electron which optically transitions. Thus, it is possible to increase the photoelectric conversion ratio of the photoelectric conversion element 20.

Figure 10:
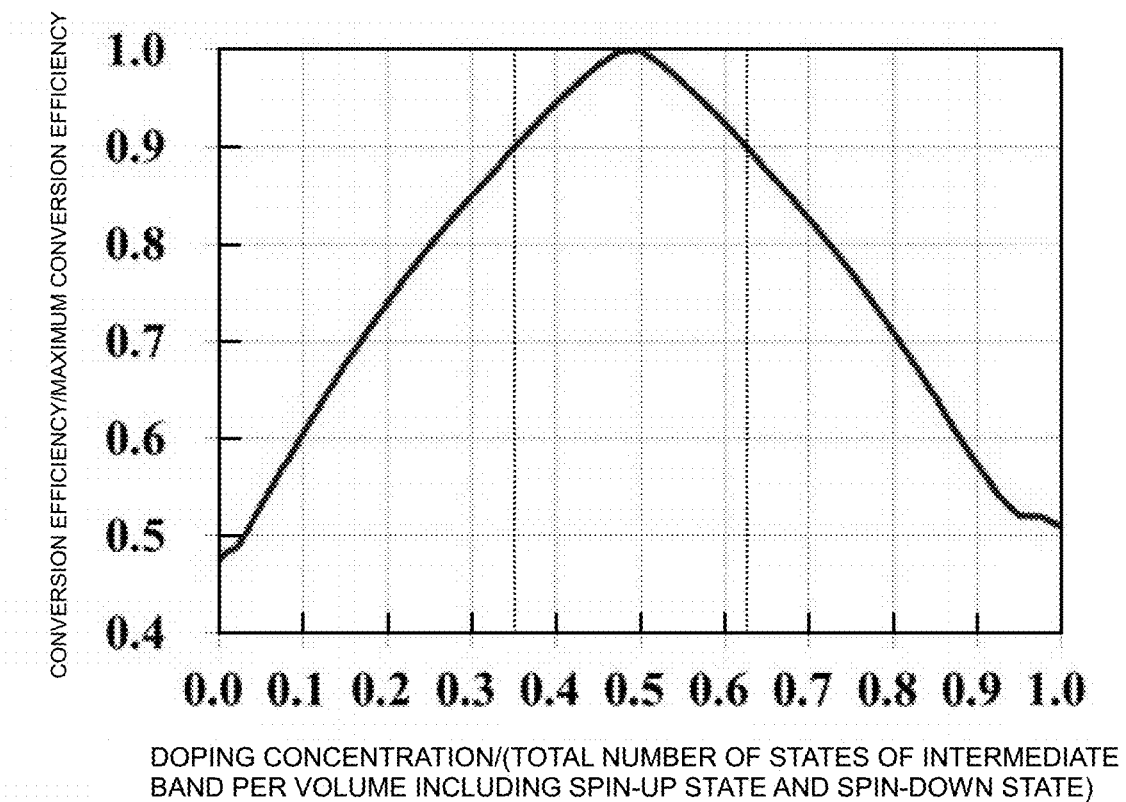
FIG. 10 is a graph illustrating a relationship of an average of doping concentrations in the superlattice semiconductor layer and a photoelectric conversion ratio.

FIG. 10 is a graph illustrating a relationship of the average n-type doping concentration in the superlattice semiconductor layer, and the photoelectric conversion ratio. This graph may be obtained by self-consistently solving the Poisson's equation, the current continuity equation, an expression for balancing transition processes through the intermediate band, and this graph is calculated through a device simulation of a quantum dot solar cell. The average doping concentration ($cm^{-3}$) in the superlattice semiconductor layer is represented by a ratio with two times the number of quantum dots per unit volume (that is, the total number of states of the intermediate band per volume including the spin-up state and the spin-down state). As illustrated in FIG. 10, the average n-type doping concentration in the quantum dot layer 6 is set to be in a range of 35% or more and 62% or less of two times the number of quantum dots 7 per unit volume (that is, the total number of states of the intermediate band per volume including the spin-up state and the spin-down state), and thus it is possible to cause the photoelectric conversion ratio of the photoelectric conversion element 20 to be equal to or more than 90% of the maximum photoelectric conversion ratio.

When the superlattice semiconductor layer 10 has the region having a relatively high n-type doping concentration and the region having a relatively low n-type doping concentration, the region having a relatively high n-type doping concentration may be provided in the region of the superlattice semiconductor layer 10, which is near to the n-type semiconductor layer 12.

Since the intermediate energy band 25 is inclined by an internal electric field which is formed by the p-type semiconductor layer 4 and the n-type semiconductor layer 12, and the energy of the intermediate energy band 25 becomes smaller as the intermediate energy band 25 approaches the n-type semiconductor layer 12, electrons in the intermediate energy band 25 easily accumulate in the region near to the n-type semiconductor layer 12. Accordingly, it is considered that an electron in the intermediate energy band 25 easily recombines with a hole in the valence band, in this region. Thus, the n-type dopant concentration in the region of the superlattice semiconductor layer 10, which is near to the n-type semiconductor layer 12 increases and the hole concentration in the valence band in this region decreases, and thus it is possible to decrease the speed of an electron in the intermediate energy band 25 recombining with a hole in the valence band.

In this manner, the region of the superlattice semiconductor layer 10, which has a relatively high n-type doping concentration may be provided in a region in which electrons in the intermediate energy band easily accumulate. Thus, it is possible to decrease the speed of an electron in the intermediate energy band recombining with a hole in the valence band.

The doping concentration in the region of the superlattice semiconductor layer 10, which has a relatively high n-type doping concentration may be less than, for example, two times the number of quantum dots per unit volume (that is, the total number of states of the intermediate band per volume including the spin-up state and the spin-down state), and higher than the doping concentration in the region which has a relatively low n-type doping concentration. When a plurality of intermediate energy bands are formed in the quantum dot 7 of the superlattice semiconductor layer 10, the doping concentration in the region of the superlattice semiconductor layer 10, which has a relatively high n-type doping concentration may be smaller than, for example, the product of the number of quantum dots per volume and the number of intermediate energy bands (that is, the total number of states of the intermediate band per volume including the spin-up state and the spin-down state), and may be higher than the doping concentration in the region having a relatively low n-type doping concentration.

The intermediate energy band 25 has a region having a wide band width and a region having a narrow band width. For example, as illustrated in the band diagrams of FIGS. 3, 5, 7, 8, and 9, the quantum layer 5 and the barrier layer 8 may be provided such that the intermediate energy band 25 has the region having a wide band width and the region having a narrow band width.

The band width of the intermediate energy band 25 becomes wider as the distance between two adjacent quantum layers 5 becomes shorter, and the band width of the intermediate energy band 25 becomes narrower as the distance becomes longer. This is because wave functions of electrons in two adjacent quantum layers 5 overlap each other more as a distance between the two quantum layers 5 becomes smaller, and these wave functions overlap each other less as the distance between the two quantum layers 5 becomes smaller.

Accordingly, the intermediate energy band 25 which has the region having a wide band width and the region having a narrow band width may be formed by providing the region in which a distance between two adjacent quantum layers 5 is long, and the region in which a distance between the between two adjacent quantum layers 5 is short, in the superlattice semiconductor layer 10. In this case, the intermediate energy band 25 of the region having a wide band width is formed in the region of the superlattice semiconductor layer 10, in which a distance between two adjacent quantum layers 5 is short. The intermediate energy band 25 of the region having a narrow band width is formed in the region of the superlattice semiconductor layer 10, in which a distance between two adjacent quantum layers 5 is long.

A distance between the quantum layers 5 may be investigated by analyzing a sectional surface of the superlattice semiconductor layer 10 by using an SEM or a TEM.

Figure 15:
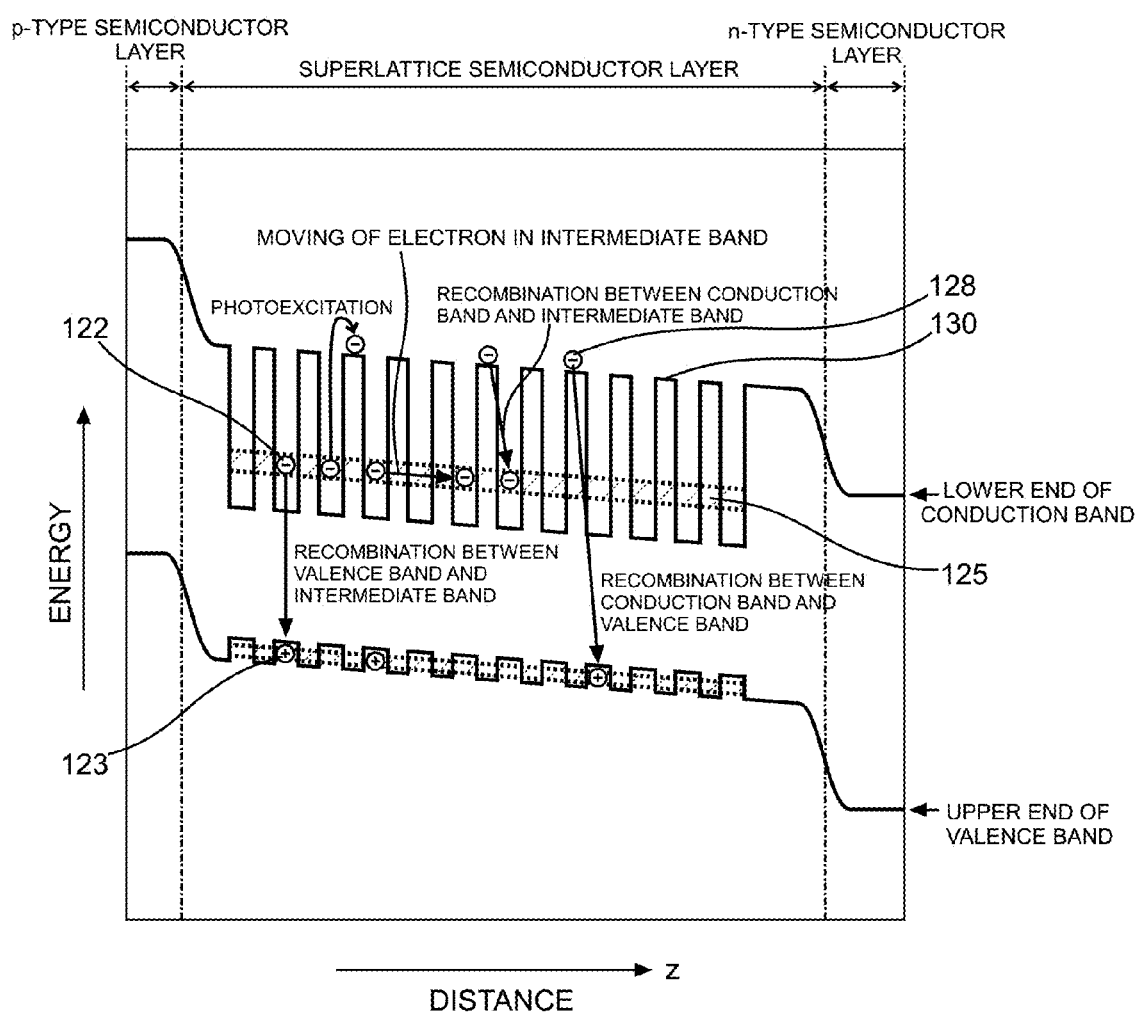
FIG. 15 is a schematic band diagram of a photoelectric conversion layer included in a photoelectric conversion element of the related art.

In the superlattice semiconductor layer of the related art, which has a band diagram as illustrated in FIG. 15, the intermediate energy band 125 has a potential gradient by an internal electric field. However, since the width of the intermediate energy band 125 is substantially constant in the superlattice semiconductor layer of the related art, the potential of the intermediate energy band 125 has a small gradient in view of causing power which is obtained from the photoelectric conversion element to be maximum. Accordingly, the probability that an electron which has optically transitioned to the intermediate energy band 125 from the valence band does not move in the intermediate energy band, but stays in the quantum layer to which the electron has optically transitioned for a relatively long time becomes higher. Since a hole in the valence band is generated in the quantum layer to which an electron optically transitions, if an electron which optically transitions stays in this quantum layer, the probability of the electron recombining with a hole becomes higher. Accordingly, in the photoelectric conversion element of the related art, it is considered that the photoelectric conversion ratio is low.

Since the superlattice semiconductor layer 10 is provided in the photoelectric conversion element 20 according to this embodiment such that the intermediate energy band 25 which has the region having a wide band width and the region having a narrow band width is formed, it is possible to generate an energy difference between the region of the intermediate energy band 25, which has a narrow band width, and the region having a wide band width. This energy difference enables an electron in the region having a narrow band width of the intermediate energy band 25 to move to the region having a wide band width. Thus, it is possible to spatially separate an electron which optically transitions and a hole which is generated in the valence band by this optical transition, in the region having a narrow band width of the intermediate energy band 25 and to suppress recombination of an electron and a hole.

For example, the superlattice semiconductor layer 10 may be provided such that the width of the intermediate energy band 25 as illustrated in FIG. 3 becomes wider in stages with becoming near to the n-type semiconductor layer 12. The superlattice semiconductor layer 10 may be provided such that the width of the intermediate energy band 25 as illustrated in FIG. 5 becomes gradually wider with becoming near to the n-type semiconductor layer 12. As illustrated in FIGS. 7, 8, and 9, the superlattice semiconductor layer 10 may be provided such that a region in which the intermediate energy band has a wide width and a region in which the intermediate energy band has a narrow width are alternately disposed.

For example, as illustrated in FIGS. 3, 5, 7, and 9, the superlattice semiconductor layer 10 may be formed such that the intermediate energy band 25 of the region having a wide band width is formed in the region of the superlattice semiconductor layer 10, which is near to the n-type semiconductor layer 12. If the intermediate energy band 25 which is formed in the region of the superlattice semiconductor layer 10, which is near to the n-type semiconductor layer 12 has a wide band width, electrons are easily moved to the intermediate energy band 25 of this region and thus the electron concentration increases. Thus, in this region, the speed of an electron in the intermediate energy band 25 optically transitioning to the conduction band increases and the speed of recombination with a hole in the valence band also increases. Accordingly, in order to increase an extent of optical transition to the conduction band in this region, a method of causing this region and a solar light receiving surface to be near to each other, a method of widening an absorption region of solar light by extending the intermediate energy band width, a method of increasing the n-type doping concentration in this region, and the like are used. An electron which has optically transitioned to the conduction band may be easily moved to the n-type semiconductor layer 12, and thus it is possible to decrease the speed of the electron which has optically transitioned to the conduction band recombining with a level in the intermediate energy band 25. Accordingly, it is possible to increase the photoelectric conversion ratio of the photoelectric conversion element 20.

When the superlattice semiconductor layer 10 has the region having a high n-type doping concentration and the region having a low n-type doping concentration, the superlattice semiconductor layer 10 may be provided such that the intermediate energy band 25 having a wide band width is formed in the region of the superlattice semiconductor layer, which has a high n-type doping concentration and the intermediate energy band 25 having a narrow band width is formed in the region of the superlattice semiconductor layer 10, which has a low n-type doping concentration. Thus, it is possible to suppress an increase of the speed of an electron in the intermediate energy band 25 recombining with a hole in the valence band, and it is possible to increase the photoelectric conversion ratio of the photoelectric conversion element 20.

If the intermediate energy band 25 has the region having a wide band width and the region having a narrow band width, the electron concentration in the intermediate energy band 25 of the region having the wide band width increases by the energy difference between the region having a narrow band width and the region having a wide band width. Accordingly, it is considered that the speed of an electron in the intermediate energy band 25 recombining with a hole in the valence band, in the region having a wide band width also increases. Thus, it is possible to suppress an increase of the speed of an electron in the intermediate energy band 25 recombining with a hole in the valence band, or it is possible to decrease this speed by increasing the n-type doping concentration in this region and decreasing the hole concentration in the valence band.

When the intermediate energy band which has the plurality of regions having a wide band width is formed in the superlattice semiconductor layer 10, the n-type doping concentration in the region of the superlattice semiconductor layer 10, which corresponds to at least one of the plurality of regions having a wide band width may increase.

Next, the superlattice semiconductor layer 10 of the photoelectric conversion element 20 according to this embodiment will be described with reference to the drawings.

Figure 2:
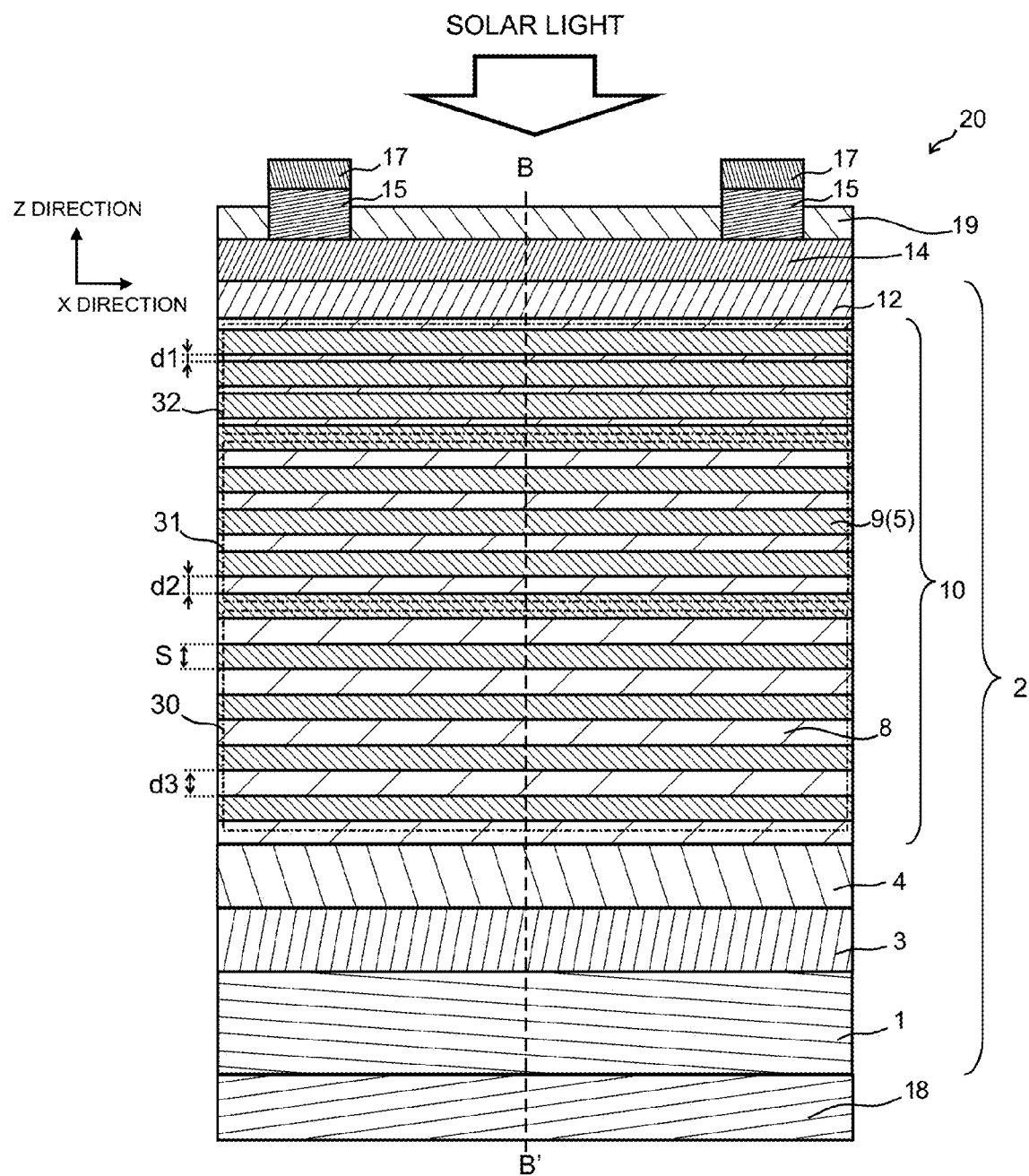
FIG. 2 is a schematic sectional view illustrating a configuration of a photoelectric conversion element according to an embodiment of the present invention.
Figure 3:
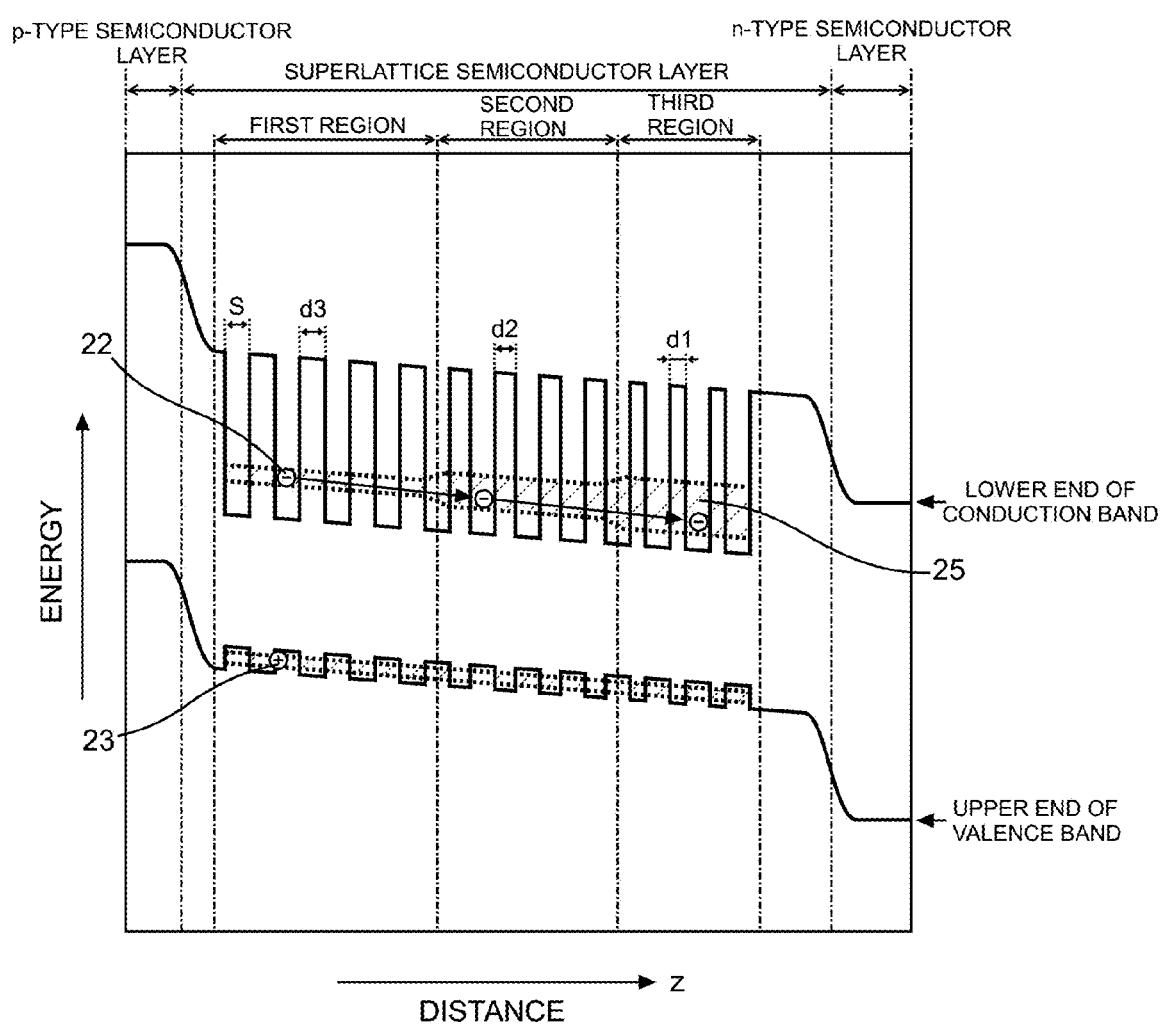
FIG. 3 is a schematic band diagram of a photoelectric conversion layer taken along dashed line A-A' in FIG. 1.

The superlattice semiconductor layer 10 may have the superlattice structure as illustrated in FIG. 1 or 2, for example. The superlattice semiconductor layer 10 of the photoelectric conversion element 20 in FIG. 1 has a superlattice structure in which the quantum dot layer 6 and the barrier layer 8 are stacked alternately and repeatedly. The superlattice semiconductor layer 10 of the photoelectric conversion element 20 in FIG. 2 has a superlattice structure in which the quantum well layer 9 and the barrier layer 8 are stacked alternately and repeatedly. The size S of all quantum dots 7 of the superlattice semiconductor layer 10 of FIG. 1 in the z direction is the same. The size S of all quantum well layers 9 of the superlattice semiconductor layer 10 of FIG. 2 in the z direction is the same. The superlattice semiconductor layer 10 in FIG. 1 or 2 has a first region 30, a second region 31, and a third region 32. In the first region 30, the quantum layer 5 and the barrier layer 8 are stacked such that a distance between two adjacent quantum layers 5 (quantum dot layer 6 or quantum well layer 9) is set to d3. d3 is longer than d1 and d2. In the second region 31, the quantum layer 5 and the barrier layer 8 are stacked such that a distance between two adjacent quantum layers 5 is set to d2. d2 is shorter than d3 and longer than d1. In the third region 32, the quantum layer 5 and the barrier layer 8 are stacked such that a distance between two adjacent quantum layers 5 is set to d1. d1 is shorter than d2 and d3.

In this manner, in the superlattice semiconductor layer 10 of FIG. 1 or 2, a distance between two adjacent quantum layers 5 becomes narrower in stages as the two adjacent quantum layers 5 approaches the n-type semiconductor layer 12.

FIG. 1 or 2 illustrates the superlattice semiconductor layer 10 in which three regions are provided in the superlattice semiconductor layer 10 and a distance between two adjacent quantum layers 5 becomes narrower in stages. However, the superlattice semiconductor layer 10 which is included in the photoelectric conversion element 20 according to this embodiment may be provided such that regions of which the number may be 2, 4, 5, 6, 7, 8, 9, and 10 are included, and a distance between two adjacent quantum layers 5 becomes narrower in stages as the two adjacent quantum layers 5 approaches the n-type semiconductor layer 12.

FIG. 3 is a schematic band diagram of the photoelectric conversion layer 2 taken along dashed line A-A' in FIG. 1. A band diagram of the photoelectric conversion layer 2 taken along dashed line B-B' in FIG. 2 is the same as in FIG. 3 (differences in the x and y directions occur). In FIG. 3, the intermediate energy band 25 is formed by quantum levels of the quantum layers 5. In the first region 30 in which a distance between two adjacent quantum layers 5 is wide, the band width of the intermediate energy band 25 is narrow and an energy potential of an electron is high. In the third region 32 in which a distance between two adjacent quantum layers 5 is narrow, the band width of the intermediate energy band 25 is wide and an energy potential of an electron at the lower end of the intermediate energy band is low. In the second region 31, the width of the intermediate energy band 25 and the energy potential of an electron are intermediate between those in the first region 30 and the third region 32.

Accordingly, if the superlattice structure of the superlattice semiconductor layer 10 is formed as illustrated in FIG. 1 or 2, the intermediate energy band 25 in which the band width becomes wider in stages with approaching the n-type semiconductor layer 12 and the energy potential becomes lower in stages may be formed in the superlattice semiconductor layer 10.

In FIG. 1 or 2, the superlattice semiconductor layer 10 is provided such that the band width of the intermediate energy band 25 becomes wider at three stages. However, the superlattice semiconductor layer 10 of the photoelectric conversion element 20 according to this embodiment may be provided such that the band width becomes wider at several stages, for example, 2, 4, 5, 6, 7, 8, 9, or 10 stages, with approaching the n-type semiconductor layer 12.

In the photoelectric conversion layer 2 having the band diagram as in FIG. 3, when an electron of the valence band in the first region 30 optically transitions to the intermediate energy band 25, an electron 22 of the intermediate energy band 25 easily move to the second region 31 having a lower energy potential. Thus, it is possible to spatially separate the electron 22 which has optically transitioned to the intermediate energy band 25 in the first region 30 and a hole 23 which has been generated in the valence band by the optical transition, from each other. It is possible to decrease the probability of an electron in the intermediate energy band 25 recombining with a hole in the valence band.

When an electron of the valence band in the second region 31 optically transitions to the intermediate energy band 25, an electron in the intermediate energy band 25 easily moves to the third region 32 having a lower energy potential. Thus, it is possible to spatially separate an electron which has optically transitioned to the intermediate energy band 25 in the second region 31 and a hole which has been generated in the valence band by the optical transition, from each other. It is possible to decrease the probability of an electron in the intermediate energy band 25 recombining with a hole in the valence band. In addition, there are many cases in which the band offset is small in the valence band and the band (miniband) on the valence band side may be uniformly viewed in many cases. That is, as an advantageous effect of the present invention, the speed of an electron in the intermediate energy band moving decreases, but a speed of a hole in the valence band moving is not greatly changed. Thus, a speed of spatially separating an electron and a hole from each other becomes fast.

The photoelectric conversion element 20 as illustrated in FIG. 1 or 2 may be provided such that light is incident to the photoelectric conversion layer 2 from the n-type semiconductor layer side. Thus, it is possible to suppress recombination of an electron in the intermediate energy band 25 in which an electron can optically transition to the conduction band with a high probability, with a hole in the valence band, in the third region (region nearest to the n-type semiconductor layer) in which the energy potential is lowest and electrons easily accumulate in the intermediate energy band.

In the third region 32 in which the band width of the intermediate energy band 25 is wide, the absorption band of the optical spectrum is wide between the valence band and the intermediate energy band, and between the intermediate energy band and the conduction band. Accordingly, it is possible to increase the photoexcitation speed of an electron from the intermediate energy band in the third region 32 in which electrons easily accumulate, to the conduction band, and to increase the photoelectric conversion ratio of the photoelectric conversion element.

In the photoelectric conversion element 20 as illustrated in FIG. 1 or 2, the region (third region) of the superlattice semiconductor layer 10, which is near to the n-type semiconductor layer 12 may have a higher n-type doping concentration than those of other regions. Thus, it is possible to decrease the hole concentration in the third region, and to suppress recombination of an electron in the intermediate energy band and a hole in the valence band, in the third region in which the energy potential is lowest and electrons easily accumulate in the intermediate energy band.

The superlattice semiconductor layer 10 may have a superlattice structure as illustrated in FIG. 4, for example. The superlattice semiconductor layer 10 of the photoelectric conversion element 20 in FIG. 4 has the superlattice structure in which the quantum dot layer 6 and the barrier layer 8 are stacked alternately and repeatedly. The size S of all quantum dots 7 of the superlattice semiconductor layer 10 of FIG. 4 in the Z direction is the same. In the superlattice semiconductor layer 10 of FIG. 4, stacking is performed such that the distances d1 to d11 between two adjacent quantum layers 5 gradually becomes shorter with approaching the n-type semiconductor layer 12.

FIG. 4 illustrates the superlattice semiconductor layer 10 in which the distances d1 to d11 between two adjacent quantum layers 5 gradually becomes shorter for each layer with approaching the n-type semiconductor layer 12. However, the superlattice semiconductor layer 10 included in the photoelectric conversion element 20 according to this embodiment may have a structure in which a distance between two adjacent quantum layers 5 becomes shorter for each of several layers, for example, two layers, three layers, four layers, and five layers, with approaching the n-type semiconductor layer 12.

FIG. 5 is a schematic band diagram of the photoelectric conversion layer 2 taken along dashed line C-C' in FIG. 4. In FIG. 5, the intermediate energy band 25 is formed by the quantum level of the quantum layer 5. Since the distance between two adjacent quantum layers 5 gradually becomes shorter with approaching the n-type semiconductor layer 12, the width of the intermediate energy band 25 gradually becomes wider with approaching the n-type semiconductor layer 12.

Accordingly, if the superlattice structure of the superlattice semiconductor layer 10 is formed as illustrated in FIG. 4, the intermediate energy band 25 in which the band width becomes wider gradually in stages with approaching the n-type semiconductor layer 12 and the energy potential becomes lower monotonously may be formed in the superlattice semiconductor layer 10.

In the photoelectric conversion layer 2 having the band diagram as in FIG. 5, when an electron of the valence band optically transitions to the intermediate energy band 25, an electron of the intermediate energy band 25 easily move to the intermediate energy band 25 on the n-type semiconductor layer 12, which has a lower energy potential. Thus, it is possible to spatially separate the electron which has optically transitioned to the intermediate energy band 25 and a hole which has been generated in the valence band by the optical transition, from each other. It is possible to decrease the probability of an electron in the intermediate energy band 25 recombining with a hole in the valence band.

The photoelectric conversion element 20 as illustrated in FIG. 4 may be provided such that light is incident to the photoelectric conversion layer 2 from the n-type semiconductor layer side. Thus, it is possible to suppress recombination of an electron in the intermediate energy band 25 in which an electron can optically transition to the conduction band with a high probability, with a hole in the valence band in the region which is nearest to the n-type semiconductor layer and has the smallest energy potential in the intermediate energy band, and in which electrons easily accumulate.

In the photoelectric conversion element 20 as illustrated in FIG. 4, the region of the superlattice semiconductor layer 10, which is near to the n-type semiconductor layer 12 may have an n-type doping concentration higher than those in other regions. Thus, it is possible to decrease the hole concentration in the region of the superlattice semiconductor layer 10, which is near to the n-type semiconductor layer 12, and to suppress recombination of an electron in the intermediate energy band 25 with a hole in the valence band, in the region in which the energy potential is lowest in the intermediate energy band 25 and electrons easily accumulate.

The superlattice semiconductor layer 10 may have a superlattice structure as illustrated in FIG. 6, for example. The superlattice semiconductor layer 10 of the photoelectric conversion element 20 in FIG. 6 has the superlattice structure in which the quantum dot layer 6 and the barrier layer 8 are stacked alternately and repeatedly. The size S of all quantum dots 7 of the superlattice semiconductor layer 10 in FIG. 6 in the z direction is the same. The superlattice semiconductor layer 10 in FIG. 6 has the first region 30 and the second region 31 which are alternately provided. In the first region 30, the quantum layer 5 and the barrier layer 8 are stacked such that the distance between two adjacent quantum layers 5 is set to d2. d2 is longer than d1. In the second region 31, the quantum layer 5 and the barrier layer 8 are stacked such that the distance between two adjacent quantum layers 5 is set to d1. d2 is longer than d1.

In this manner, in the superlattice semiconductor layer 10 of FIG. 6, the first region having a long distance between two adjacent quantum layers 5 and the second region having a short distance between two adjacent quantum layers 5 are alternately provided. It is possible to prevent accumulation of electrons only in one region of the superlattice semiconductor layer 10, in which the intermediate band energy width is wide, or only in a specific narrow region, for example, a region in the vicinity of an interface between the superlattice semiconductor layer 10 and the n-type semiconductor layer 12 in a case of FIG. 5, by provision in this manner. It is possible to disperse a spatial distribution of an electron and a hole.

FIG. 7 is a schematic band diagram of the photoelectric conversion layer 2 taken dashed line E-E' in FIG. 6. In FIG. 7, the intermediate energy band 25 is formed by the quantum level of the quantum layer 5. In the first region 30 in which a distance between two adjacent quantum layers 5 is long, the band width of the intermediate energy band 25 is narrow and an energy potential of an electron at the lower end of the intermediate energy band 25 is high. In the second region 31 in which a distance between two adjacent quantum layers 5 is short, the band width of the intermediate energy band 25 is wide and the energy potential of an electron at the lower end of the intermediate energy band 25 is low.

Accordingly, if the superlattice structure of the superlattice semiconductor layer 10 is formed as illustrated in FIG. 6, the intermediate energy band 25 in which the region having a wide band width and the region having a narrow band width are alternately included may be formed in the superlattice semiconductor layer 10. Thus, it is possible to move an electron which exists in a region at the lower end of the intermediate energy band 25, in which the energy potential of an electron is high, to a region at the lower end of the intermediate energy band 25, in which the energy potential of an electron is low. It is possible to suppress accumulation of electrons in one region of the intermediate energy band.

In FIGS. 6 and 7, the region in which the intermediate energy band 25 in which a distance between two adjacent quantum layers 5 is short and the band width is wide is formed in the region of the superlattice semiconductor layer 10, which is near to the n-type semiconductor layer 12. However, in the superlattice semiconductor layer 10 according to this embodiment, as illustrated in FIG. 8, the region in which the intermediate energy band 25 in which a distance between two adjacent quantum layers 5 is short and the band width is wide may be formed in the region of the superlattice semiconductor layer 10, which is near to the n-type semiconductor layer 12. Accordingly, it is possible to suppress excessive accumulation of electrons in the region of the superlattice semiconductor layer 10, which is near to the n-type semiconductor layer 12. Such a configuration is effective in a case where a strong internal electric field is applied to the interface between the superlattice semiconductor layer 10 and the n-type semiconductor layer 12. The band width of the intermediate energy band 25 which is formed in the region of the superlattice semiconductor layer 10, which is near to the n-type semiconductor layer 12 may be appropriately adjusted in accordance with an internal electric field which will be formed.

As illustrated in FIG. 9, the band widths of the plurality of regions having a narrow band width and the band widths of the plurality of regions having a wide band width may be uneven. When the band widths of the plurality of regions having a wide band width are uneven, the superlattice semiconductor layer 10 may be provided such that the band widths of the plurality of regions having a wide band width become wider with approaching the light receiving surface. If such a configuration is formed, electrons more easily accumulate in the region nearer to the light receiving surface among the plurality of regions having a wide band width in the intermediate energy band 25 formed in the superlattice semiconductor layer 10. A light absorption amount of the superlattice semiconductor layer 10 becomes greater in a region nearer to the light receiving surface. Accordingly, it is possible to promote optical transition of electrons which accumulate in the region of the intermediate energy band 25, which has a wide band width, to the conduction band.

In the photoelectric conversion layer 2 having the band diagram as illustrated in FIG. 7, when an electron of the valence band in the first region 30 optically transitions to the intermediate energy band 25, an electron of the intermediate energy band 25 easily move to the second region 31 having a lower energy potential at the lower end of the intermediate energy band. Thus, it is possible to spatially separate an electron which has optically transitioned to the intermediate energy band 25 in the first region 30 and a hole which has been generated in the valence band by the optical transition, from each other. It is possible to decrease the probability of an electron in the intermediate energy band 25 recombining with a hole in the valence band. It is possible to spatially disperse electrons in the plurality of regions in the intermediate energy band by alternately providing the first region 30 and the second region 31.

In the photoelectric conversion element 20 as illustrated in FIG. 6, the region (second region) in which a distance between two adjacent quantum layers 5 is short may have an n-type doping concentration higher than that in the region (first region) in which a distance between two adjacent quantum layers 5 is long. Thus, it is possible to decrease the hole concentration in the second region. It is possible to suppress recombination of an electron in the intermediate energy band 25 with a hole in the valence band, in the second region of the in the intermediate energy band 25, in which the energy potential is low at the lower end of the intermediate energy band and electrons easily accumulate.

When the intermediate energy band 25 is formed in the superlattice semiconductor layer 10, as illustrated in FIG. 9, it is possible to increase the n-type doping concentration in the region of the superlattice semiconductor layer 10, in which at least the intermediate energy band 25 having the widest band width is formed.

4. Manufacturing Method of Photoelectric Conversion Element Having Superlattice Structure Regarding the quantum dot layer 6, a quantum dot may be manufactured by using a method referred to as Stranski-Krastanov (S-K) growth, in which a molecular beam epitaxy (MBE) method or an metal-organic chemical vapor deposition (MOCVD) method is used, an electron lithography technology, a droplet epitaxy method, and the like. In the S-K growth, a crystal mixture ratio of the quantum dot may be adjusted by changing a composition ratio of raw materials which are used in the above method, and the size of the quantum dot may be adjusted by changing a growth temperature, pressure, a deposition period of time, and the like.

In manufacturing of the photoelectric conversion element 20 according to this embodiment, for example, the photoelectric conversion element 20 having the superlattice structure may be manufactured by using the molecular beam epitaxy (MBE) method which is excellent in film thickness control, the metal-organic chemical vapor deposition (MOCVD) method, or the like. Here, a manufacturing method of an example of the photoelectric conversion element having the superlattice structure will be described.

For example, a p-GaAs substrate (p-type semiconductor substrate) 1 is washed with an organic cleaning liquid, and then is washed with a sulfate cleaning liquid, and then further stream cleaning is performed. Then, the p-GaAs substrate after cleaning is installed in an MOCVD apparatus. A buffer layer 3 is formed on this substrate. The buffer layer 3 is layer used for improving crystallinity of all light absorbing layers which are formed on the buffer layer 3. As the buffer layer 3, a GaAs layer is formed, for example. Crystal growth for a p-type GaAs layer (p-type semiconductor layer) 4 having a thickness of 300 nm and a GaAs layer which is used as the barrier layer 8 is performed on the buffer layer 3 and then the quantum dot layer 6 which is formed of InAs is formed by using self-organizing growth. At this time, a deposition period of time, temperature, pressure, a feed rate of a raw material, a composition ratio of raw materials, and the like are appropriately changed, and thus the size or a composition ratio of the quantum dot may be adjusted to have a desired value.

The crystal growth of the barrier layer 8 and the quantum dot layer 6 is repeated from the quantum dot layer 6 which is nearest to the p-type semiconductor layer 4 to a quantum dot layer which is nearest to the n-type semiconductor layer 12. A distance between two adjacent quantum dot layers 6 is adjusted to be a desired distance by changing a deposition period of time for the barrier layer 8. When n-type dopants are contained in the quantum dot layer 6, for example, the quantum dot layer 6 performs crystal growth while silane ($SiH_4$) is introduced into the quantum dot layer 6 and Si is introduced into the barrier layer 8. Si may be directly introduced into the quantum dot 7.

Then, crystal growth for an n-type GaAs layer (n-type semiconductor layer) 12 having a thickness of 250 nm is preformed and then an AlAs layer is formed as a window layer 14.

The n-type electrode 17 is formed on the contact layer 15 by using a photolithography technology, a lift-off technology, and an etching technology, and thus a photoelectric conversion element having a superlattice structure may be formed. The contact layer 15 is preferably removed by performing etching except for the right under the n-type electrode 17.

As the n-type dopant, for example, Si may be used and Zn may be used as a p-type dopant. For example, S, Se, Sn, Te, and C are used as other n-type dopants, and Be, Mg, and the like are used as other p-type dopants. As an electrode material, for example, AuGeNi and AgSn are used for the p-type GaAs layer, and AuZn, AgInZn, and the like are used for the n-type GaAs layer. These may be formed by using a resistance heating deposition method, or an EB vapor deposition method.

These may be similarly manufactured by using an InAsSb quantum dot, and an AlSb barrier layer. When these materials are used, it is preferable that the substrate be formed of GaSb from a view of reduced lattice mismatch.

Simulation Experiment

A simulation experiment was performed for a recombination speed and a carrier concentration of carriers in the superlattice semiconductor layer 10 which is interposed between the p-type semiconductor layer 4 and the n-type semiconductor layer 12. A simulation experiment was also performed for a photoelectric conversion ratio of the photoelectric conversion layer having this superlattice semiconductor layer. The superlattice semiconductor layer obtained by simulation has a structure in which a quantum dot layer and a barrier layer are alternately stacked, and contains n-type dopants. Since this experiment was for simulating an influence of the carrier concentration on the recombination speed of the carrier, the band width of the formed intermediate energy band was constant.

A simulation experiment was performed for a superlattice semiconductor layer S in which the n-type doping concentration of all quantum dot layers is 0.5 times of two times the number of quantum dots per unit volume (that is, the total number of states of the intermediate band per volume including the spin-up state and the spin-down state), and a superlattice semiconductor layer T in which the n-type doping concentration of a quantum dot layer in a region A coming into contact with the n-type semiconductor layer was 0.6 times of two times the number of quantum dots per unit volume, and the n-type doping concentration of the quantum dot layer in other regions was 0.5 times of two times the number of quantum dots per unit volume.

In the simulation experiment, the Poisson's equation, the electron continuity equation, an expression for balancing transition processes through the intermediate band were solved self-consistently considering photoexcitation through the intermediate energy band.

For simplification, light emission recombination was used between the conduction band and the valence band, light emission recombination was used between the conduction band and the intermediate energy band, and light emission recombination and SRH recombination was used between the intermediate energy band and the valence band. A band gap was 2.39 eV, the intermediate energy band was 1.48 eV, a lifetime of the SRH recombination satisfied $\tau e=\tau h=10$ nsec. The doping concentrations of the n-type semiconductor layer and the p-type semiconductor layer were $1.0\times10^{18}$ cm$^{-3}$, two times the number of quantum dots was $1.0\times10^{18}$ cm$^{-3}$, the thicknesses of the n-type semiconductor layer and the p-type semiconductor layer were 0.5 μm, the thickness of the quantum dot layer was 6 μm, surface recombination speeds of both of the electron and the hole were $1.0\times10^{3}$ cm/sec, and the simulation experiment was performed under non-light condensing conditions. A distance of the region A was set to 0.5 μm.

Figure 11:
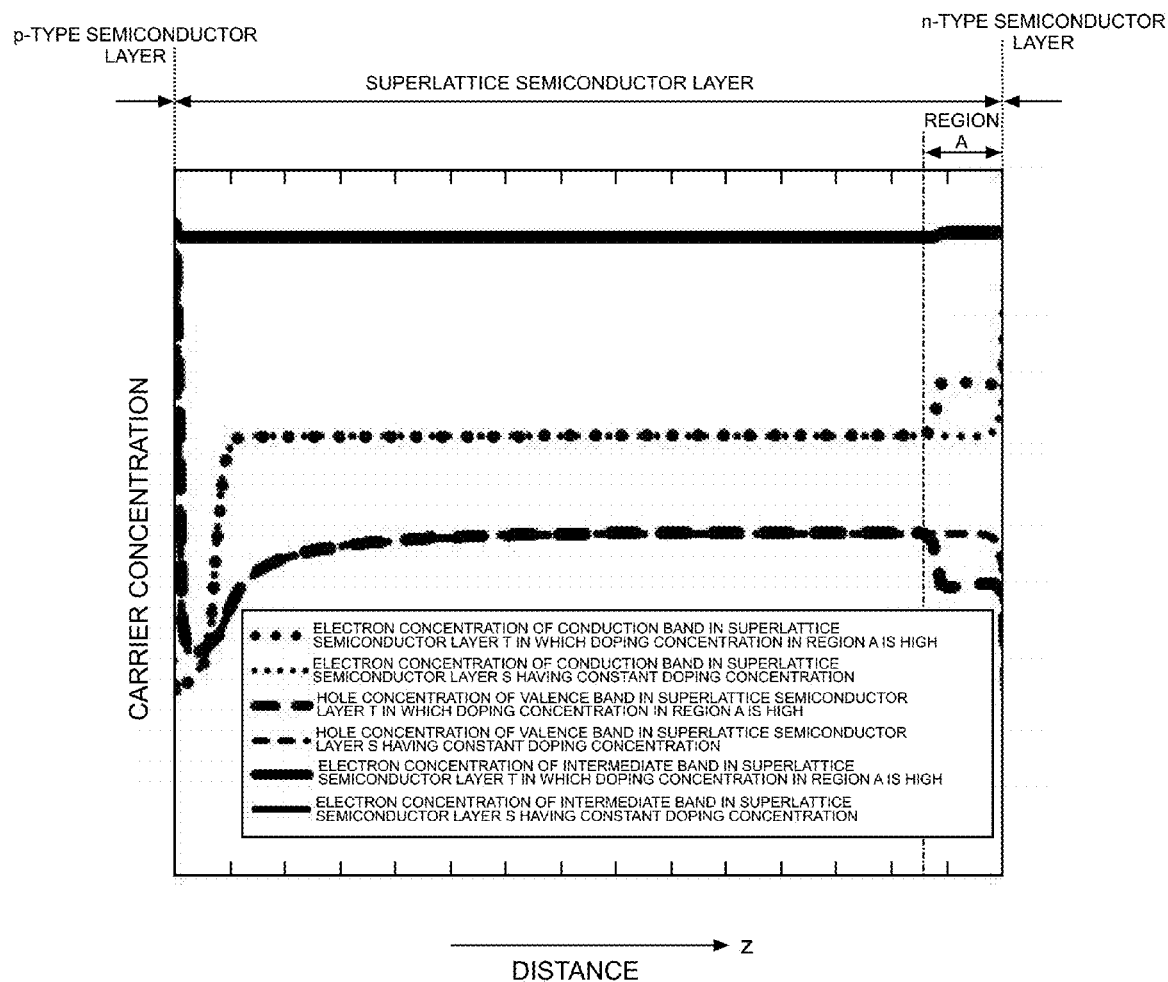
FIG. 11 is a graph illustrating a result of a simulation experiment.
Figure 12:
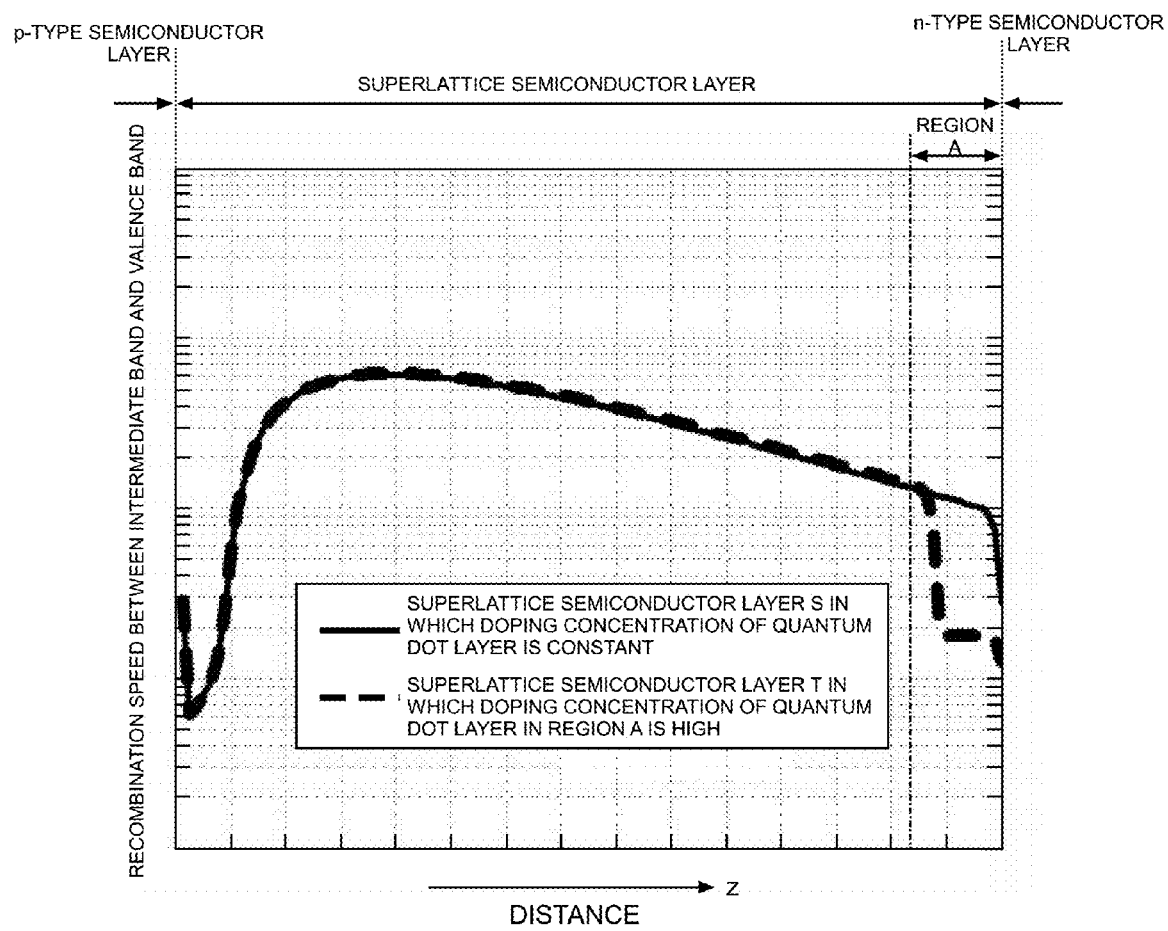
FIG. 12 is a graph illustrating a result of the simulation experiment.
Figure 13:
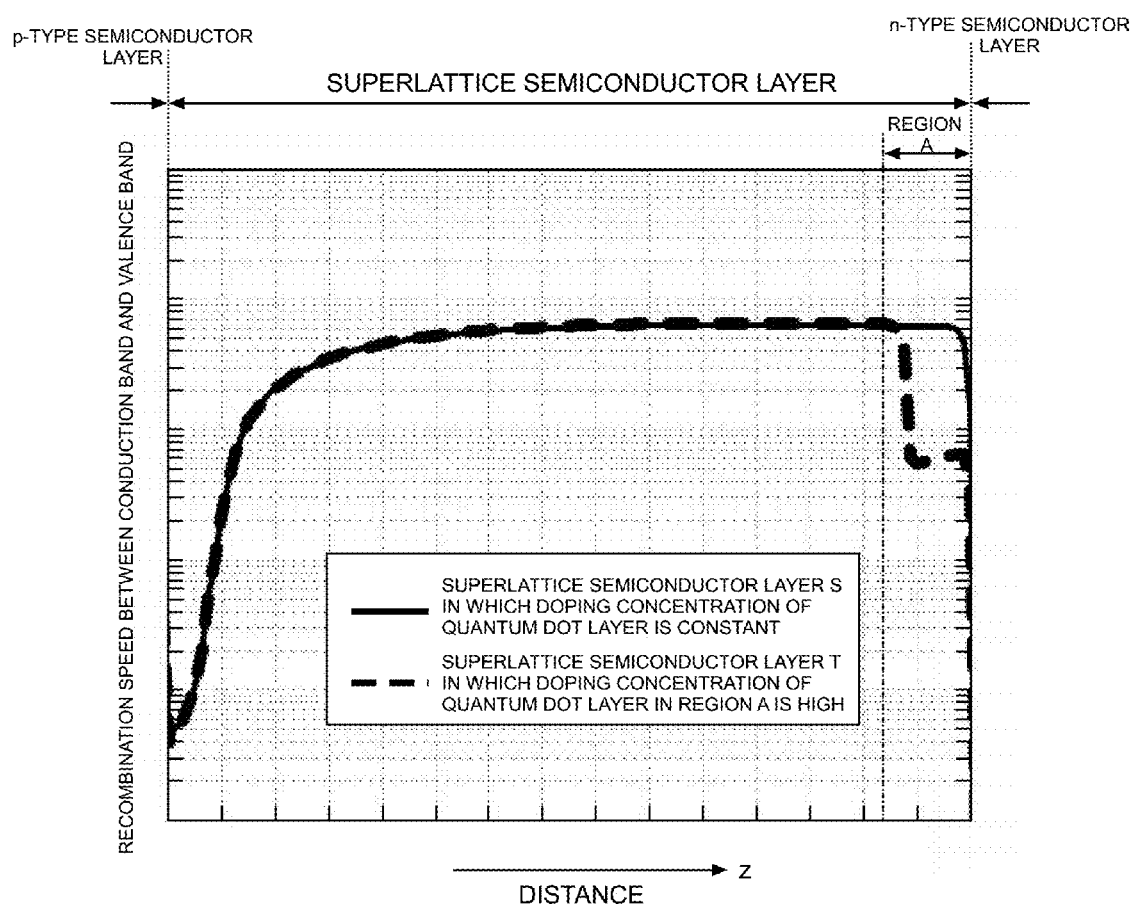
FIG. 13 is a graph illustrating a result of the simulation experiment.
Figure 14:
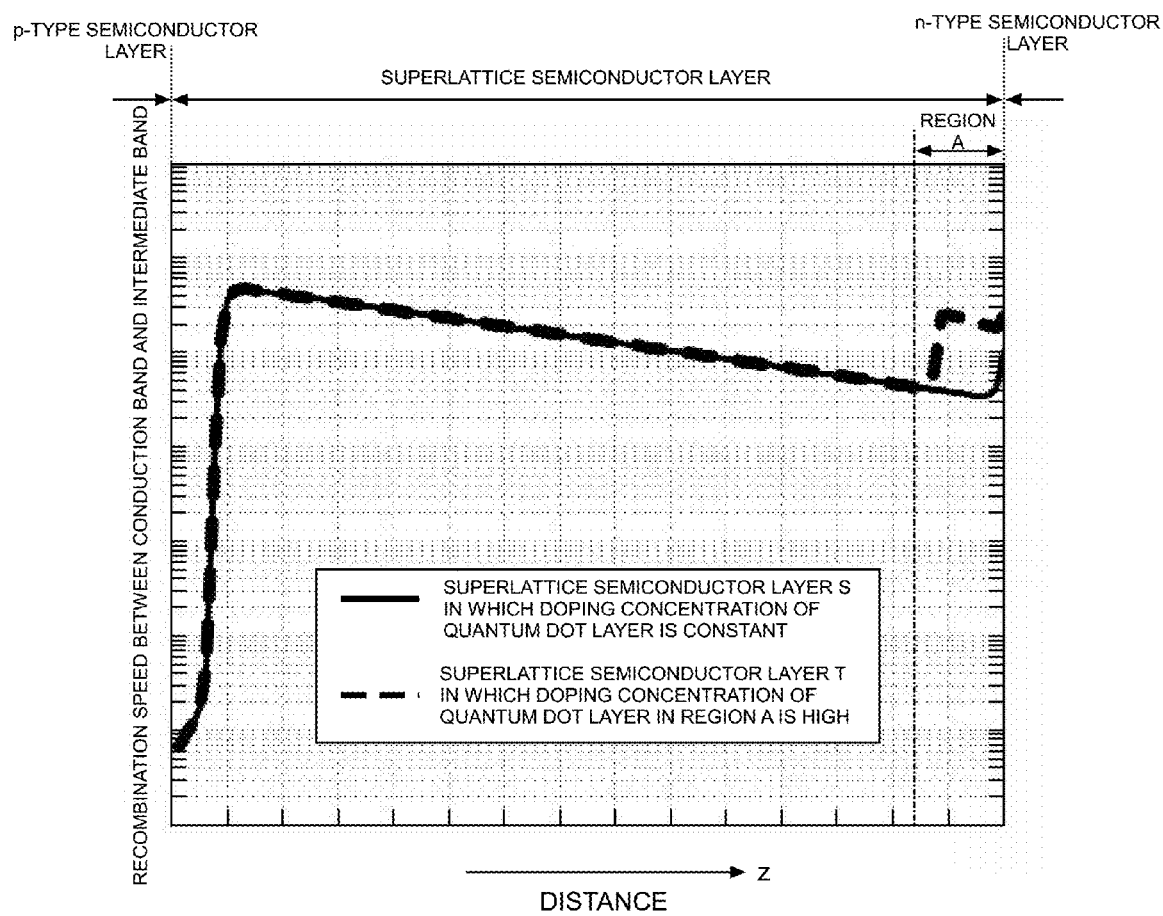
FIG. 14 is a graph illustrating a result of the simulation experiment.

FIGS. 11 to 14 illustrate a simulation result. FIG. 11 is a graph illustrating the carrier concentration in a stacking direction (Z direction) of the superlattice semiconductor layers S and T. FIG. 12 is a graph illustrating the recombination speed between the intermediate energy band and the valence band in the stacking direction (Z direction) of the superlattice semiconductor layers S and T. FIG. 13 is a graph illustrating the recombination speed between the conduction band and the valence band in the stacking direction (Z direction) of the superlattice semiconductor layers S and T. FIG. 14 is a graph illustrating the recombination speed between the intermediate energy band and the valence band in the stacking direction (Z direction) of the superlattice semiconductor layers S and T.

Since the superlattice semiconductor layers S and T are different only in that the n-type doping concentrations in the region A are different, simulation results of the superlattice semiconductor layers S and T are compared to each other, and thus an effect of the high n-type doping concentration in the region A is understood.

It was understood from the graph illustrated in FIG. 11 that the electron concentration in the conduction band was high and the hole concentration in the valence band was low in the region A of the superlattice semiconductor layer T, which had a high n-type doping concentration. It was understood that the electron concentration in the intermediate energy band of the superlattice semiconductor layer S was almost the same as in the superlattice semiconductor layer T.

It was understood from the graph illustrated in FIG. 12 that the recombination speed between the intermediate energy band and the valence band is slow in the region A of the superlattice semiconductor layer T, which had a high n-type doping concentration. It is considered that this is because the low hole concentration of the valence band in the region A has an influence on the recombination speed between the intermediate energy band and the valence band. Accordingly, it was understood that it is possible to suppress recombination of an electron in the intermediate energy band and a hole in the valence band by increasing the n-type doping concentration of the superlattice semiconductor layer.

It was understood from the graph illustrated in FIG. 13 that the recombination speed between the conduction band and the valence band is slow in the region A of the superlattice semiconductor layer T, which had a high n-type doping concentration. It is considered that this is because the low hole concentration of the valence band in the region A has an influence on the recombination speed between the conduction band and the valence band. Accordingly, it was understood that it is possible to suppress recombination of an electron in the conduction band and a hole in the valence band by increasing the n-type doping concentration of the superlattice semiconductor layer.

It was understood from the graph illustrated in FIG. 14 that the recombination speed between the conduction band and the intermediate energy band is slow in the region A of the superlattice semiconductor layer T, which had a high n-type doping concentration. It is considered that this is because the low hole concentration of the valence band in the region A has an influence on the recombination speed between the conduction band and the intermediate energy band.

In the simulation of the photoelectric conversion ratio of the photoelectric conversion layer, the photoelectric conversion layer including the superlattice semiconductor layer T which has the region A of the high n-type doping concentration had a photoelectric conversion ratio about 1% higher than that of the photoelectric conversion layer including the superlattice semiconductor layer S of a constant n-type doping concentration. In the entire region of the superlattice structure, if the n-type doping concentration is set to 0.6 times of two times the number of quantum dots per unit volume, efficiency is lower than that in FIG. 10 (efficiency is 0.92 times lower than that in a case where the n-type doping concentration is 0.5 times of two times the number of quantum dots per unit volume). Accordingly, it was understood that it is possible to cause the photoelectric conversion ratio to increase by causing the n-type doping concentration in the region of the superlattice semiconductor layer, which is near to the n-type semiconductor layer to increase.

If this simulation was performed in cases where the n-type doping concentration of the quantum dot layer in the region A was 0.8 times of two times the number of quantum dots per unit volume, and 1.0 times of two times the number of quantum dots per unit volume, the photoelectric conversion ratio also increased compared to the case where the n-type doping concentration of the quantum dot layer in the region A was 0.5 times of two times the number of quantum dots per unit volume, in these cases (0.6 time at a time of the maximum effect). Weakening an effect of conversion efficiency improvement or a problem in crystality of the semiconductor material occurs by performing doping having an amount of equal to or more than two times the number of quantum dots per unit volume. Thus, excessive n-type doping is not preferable and it is preferable that the n-type doping concentration of the quantum dot layer in the region A be set up to 1.0 times of two times the number of quantum dots per unit volume. That is, it is preferable that the n-type doping concentration of the quantum dot layer in the region A/(two times the number of quantum dots per unit volume) be higher than 0.5 and equal to or lower than 1.0.

This simulation was performed on the assumption that the number of intermediate band levels in one quantum dot was one. However, when one quantum dot has Y intermediate band levels, it is preferable that the n-type doping concentration in the region A satisfy 0.5<the n-type doping concentration of the quantum dot layer in the region A/(the number of quantum dots per unit volume×2×Y)≤1.0.

In this experiment, a simulation of the photoelectric conversion ratio obtained by adjusting the n-type doping concentration was applied to a case where the band width of the intermediate energy band was constant. However, it is considered that if the simulation is applied to a case where the band width of the intermediate energy band is not constant and the n-type doping concentration in the region having a wide band width increases, larger effect is obtained. This is because electrons in the intermediate energy band accumulate in the region having low energy at the lower end of the intermediate energy band and recombination of an electron and a hole in the region is suppressed.

The present invention is described by mainly using a solar cell, but may be applied to a photoelectric conversion apparatus such as a photodetector. In a photodetector having a different intermediate band energy width, carriers can easily move between intermediate band energy levels, similarly to the solar cell. In addition, the present invention may be used for adjusting a wavelength band which is not detected. If a superlattice structure having a changed n-type doping concentration is formed, the photoelectric conversion ratio is improved, similarly to the solar cell.

REFERENCE SIGNS LIST

1 P-TYPE SEMICONDUCTOR SUBSTRATE
2 PHOTOELECTRIC CONVERSION LAYER
3 BUFFER LAYER
4 P-TYPE SEMICONDUCTOR LAYER
5 QUANTUM LAYER
6 QUANTUM DOT LAYER
7 QUANTUM DOT
8 BARRIER LAYER
9 QUANTUM WELL LAYER
10 SUPERLATTICE SEMICONDUCTOR LAYER
12 N-TYPE SEMICONDUCTOR LAYER
14 WINDOW LAYER
15 CONTACT LAYER
17 N-TYPE ELECTRODE
18 P-TYPE ELECTRODE
19 ANTIREFLECTIVE COATING
20 PHOTOELECTRIC CONVERSION ELEMENT
22 ELECTRON
23 HOLE
25 INTERMEDIATE ENERGY BAND
30 FIRST REGION
31 SECOND REGION
32 THIRD REGION
122 ELECTRON
123 HOLE
125 INTERMEDIATE ENERGY BAND
128 ELECTRON
130 CONDUCTION BAND

The invention claimed is:

1. A photoelectric conversion element comprising:
a photoelectric conversion layer which includes a p-type semiconductor layer, an n-type semiconductor layer, and a superlattice semiconductor layer between the p-type semiconductor layer and the n-type semiconductor layer, wherein
the superlattice semiconductor layer includes a superlattice structure in which barrier layers and quantum layers are stacked alternately and repeatedly, and form an intermediate energy band between an upper end of a valence band of the barrier layer and a lower end of a conduction band of the barrier layer,
the intermediate energy band extends from a region of the superlattice semiconductor layer adjacent to the p-type semiconductor layer to a region of the superlattice semiconductor layer, which is near to the n-type semiconductor layer,
the intermediate energy band includes a region including a wider band width and a region including a narrow band width,
the superlattice semiconductor layer includes a region including a wider gap between two adjacent quantum layers and a region including a narrower gap between two adjacent quantum layers,
the intermediate energy band of the region including the wider band width is in the region of the superlattice semiconductor layer that includes the narrower gap between two adjacent quantum layers, and
the intermediate energy band of the region including the narrower band width is in the region of the superlattice semiconductor layer that includes the wider gap between two adjacent quantum layers.

2. A photoelectric conversion element comprising:
a photoelectric conversion layer including a p-type semiconductor layer, an n-type semiconductor layer, and a superlattice semiconductor layer between the p-type semiconductor layer and the n-type semiconductor layer, wherein
the superlattice semiconductor layer includes a superlattice structure in which barrier layers and quantum layers are stacked alternately and repeatedly, and forms an intermediate energy band between an upper end of a valence band of the barrier layer and a lower end of a conduction band of the barrier layer,
the intermediate energy band extends from a region of the superlattice semiconductor layer adjacent to the p-type semiconductor layer to a region of the superlattice semiconductor layer adjacent to the n-type semiconductor layer,
the intermediate energy band includes a region including a wider band width and a region including a narrower band width, and
the intermediate energy band of the region including the wider band width is in a region of the superlattice semiconductor layer that is nearer to the n-type semiconductor layer.

3. A photoelectric conversion element comprising:
a photoelectric conversion layer including a p-type semiconductor layer, an n-type semiconductor layer, and a superlattice semiconductor layer between the p-type semiconductor layer and the n-type semiconductor layer, wherein the superlattice semiconductor layer includes a superlattice structure in which barrier layers and quantum layers are stacked alternately and repeatedly, and forms an intermediate energy band between an upper end of a valence band of the barrier layer and a lower end of a conduction band of the barrier layer, the intermediate energy band extends from a region of the superlattice semiconductor layer adjacent to the p-type semiconductor layer to a region of the superlattice semiconductor layer adjacent to the n-type semiconductor layer, the intermediate energy band includes a region including a wider band width and a region including a narrower band width, the superlattice semiconductor layer contains n-type dopants, and a region of the superlattice semiconductor layer that is nearer to the n-type semiconductor layer includes an n-type doping concentration higher than that of other regions of the superlattice semiconductor layer.

4. The photoelectric conversion element according to claim 1, wherein the superlattice semiconductor layer includes n-type dopants and a region including a higher n-type doping concentration and a region including a lower n-type doping concentration, the intermediate energy band of the region including a wider band width is in the region of the superlattice semiconductor layer that includes the higher n-type doping concentration, and the intermediate energy band of the region including the narrower band width is in the region of the superlattice semiconductor layer that includes the lower n-type doping concentration.

5. The photoelectric conversion element according to claim 1, wherein the intermediate energy band of the region including the wider band width is in a region of the superlattice semiconductor layer that is nearer to the n-type semiconductor layer.

6. The photoelectric conversion element according to claim 1, wherein the superlattice semiconductor layer contains n-type dopants, and a region of the superlattice semiconductor layer that is nearer to the n-type semiconductor layer includes an n-type doping concentration higher than that of other regions of the superlattice semiconductor layer.

7. The photoelectric conversion element according to claim 2, wherein the superlattice semiconductor layer contains n-type dopants, and a region of the superlattice semiconductor layer that is nearer to the n-type semiconductor layer includes an n-type doping concentration higher than that of other regions of the superlattice semiconductor layer.

8. The photoelectric conversion element according to claim 2, wherein the superlattice semiconductor layer contains n-type dopants and a region including a higher n-type doping concentration and a region including a lower n-type doping concentration, the intermediate energy band of the region including the wider band width is in the region of the superlattice semiconductor layer that includes the higher n-type doping concentration, and the intermediate energy band of the region including the narrower band width is in the region of the superlattice semiconductor layer that includes the lower n-type doping concentration.

9. The photoelectric conversion element according to claim 3, wherein the superlattice semiconductor layer contains n-type dopants and a region including a higher n-type doping concentration and a region including a lower n-type doping concentration, the intermediate energy band of the region including the wider band width is in the region of the superlattice semiconductor layer that includes the higher n-type doping concentration, and the intermediate energy band of the region including the narrower band width is in the region of the superlattice semiconductor layer that includes the lower n-type doping concentration.

10. The photoelectric conversion element according to claim 5, wherein the superlattice semiconductor layer contains n-type dopants, and a region of the superlattice semiconductor layer that is nearer to the n-type semiconductor layer includes an n-type doping concentration higher than that of other regions of the superlattice semiconductor layer.

11. The photoelectric conversion element according to claim 5, wherein the superlattice semiconductor layer contains n-type dopants and a region including a higher n-type doping concentration and a region including a lower n-type doping concentration, the intermediate energy band of the region including the wider band width is in the region of the superlattice semiconductor layer that includes the higher n-type doping concentration, and the intermediate energy band of the region including the narrower band width is in the region of the superlattice semiconductor layer that includes the lower n-type doping concentration.

12. The photoelectric conversion element according to claim 6, wherein the superlattice semiconductor layer includes a region including a higher n-type doping concentration and a region including a lower n-type doping concentration, intermediate energy band of the region including the wider band width is formed in the region of the superlattice semiconductor layer that includes the higher n-type doping concentration, and the intermediate energy band of the region including the narrower band width is in the region of the superlattice semiconductor layer that includes the lower n-type doping concentration.

13. The photoelectric conversion element according to claim 7, wherein the superlattice semiconductor layer contains n-type dopants and a region including a higher n-type doping concentration and a region including a lower n-type doping concentration, the intermediate energy band of the region including the wider band width is in the region of the superlattice semiconductor layer that includes the higher n-type doping concentration, and the intermediate energy band of the region including the narrower band width is in the region of the superlattice semiconductor layer that includes the lower n-type doping concentration.

14. The photoelectric conversion element according to claim 10, wherein
the superlattice semiconductor layer includes a region including a higher n-type doping concentration and a region including a lower n-type doping concentration,
the intermediate energy band of the region including the wider band width is in the region of the superlattice semiconductor layer that includes the higher n-type doping concentration, and
the intermediate energy band of the region including the narrower band width is in the region of the superlattice semiconductor layer that includes the lower n-type doping concentration.

* * * * *